(12) United States Patent
Mizuuchi et al.

(10) Patent No.: US 7,474,682 B2
(45) Date of Patent: Jan. 6, 2009

(54) SEMICONDUCTOR LASER DEVICE AND LASER PROJECTOR

(75) Inventors: Kiminori Mizuuchi, Osaka (JP);
Kazuhisa Yamamoto, Osaka (JP);
Ken'ichi Kasazumi, Osaka (JP); Isao Kidoguchi, Hyogo (JP)

(73) Assignee: Panasonic Corporation, Osaka (JP)

( * ) Notice: Subject to any disclaimer, the term of this patent is extended or adjusted under 35 U.S.C. 154(b) by 185 days.

(21) Appl. No.: 10/584,091

(22) PCT Filed: Dec. 21, 2004

(86) PCT No.: PCT/JP2004/019123
§ 371 (c)(1),
(2), (4) Date: Jun. 22, 2006

(87) PCT Pub. No.: WO2005/062433
PCT Pub. Date: Jul. 7, 2005

(65) Prior Publication Data
US 2007/0165685 A1    Jul. 19, 2007

(30) Foreign Application Priority Data
Dec. 22, 2003    (JP) .............................. 2003-425600

(51) Int. Cl.
*H01S 5/00*    (2006.01)
(52) U.S. Cl. .................... 372/46.01; 372/43.01; 372/87
(58) Field of Classification Search .............. 372/46.01, 372/87
See application file for complete search history.

(56) References Cited

U.S. PATENT DOCUMENTS 4,751,719 A    6/1988    Mito et al.
4,882,607 A    11/1989   Shinada
4,932,034 A    6/1990    Usami et al.
5,170,402 A    12/1992   Ogita et al.
5,347,526 A    9/1994    Suzuki et al.
5,358,898 A    10/1994   Ogita et al.

(Continued)

FOREIGN PATENT DOCUMENTS

CN    1093836 A    10/1994

(Continued)

OTHER PUBLICATIONS

D. F. Welch et al., "1.1 W CW, Diffraction-Limited Operation of a Monolithically Integrated Flared-Amplifier Master Oscillator Power Amplifier", Electronics Letters, vol. 28, No. 21, Oct. 8, 1992, pp. 2011-2013.

(Continued)

*Primary Examiner*—Dung T Nguyen
(74) *Attorney, Agent, or Firm*—Wenderoth, Lind & Ponack, L.L.P.

(57) ABSTRACT

In a semiconductor laser device (10) having different facet reflectivities, an electrode disposed on a stripe ridge (107a) is divided into four electrode parts (1), (2), (3), and (4), and a larger injection current is injected to an electrode part that is closer to a light emission facet side. Further, a carrier density distribution in an active layer that is opposed to the stripe ridge can be matched to a light intensity distribution in the active layer, thereby preventing degradation in high output characteristic due to destabilization of a transverse mode and reduction in gain which are caused by spatial hole burning.

31 Claims, 12 Drawing Sheets

U.S. PATENT DOCUMENTS

| | | | |
|---|---|---|---|
| 5,469,457 | A | 11/1995 | Nagai et al. |
| 5,561,682 | A | 10/1996 | Aoki et al. |
| 5,781,222 | A | 7/1998 | Yamawaki et al. |
| 6,175,440 | B1 | 1/2001 | Conemac |
| 6,600,764 | B1 | 7/2003 | Garbuzov et al. |
| 6,649,938 | B1 | 11/2003 | Bogatov et al. |
| 2002/0141467 | A1 | 10/2002 | Iwai et al. |
| 2002/0154393 | A1 | 10/2002 | Hamamoto |
| 2003/0007524 | A1 | 1/2003 | Gotoda |
| 2004/0080811 | A1 | 4/2004 | Shimizu et al. |

FOREIGN PATENT DOCUMENTS

| | | | |
|---|---|---|---|
| EP | 0 205 139 | | 12/1986 |
| EP | 0 332 453 | | 9/1989 |
| EP | 1 063 743 | | 12/2000 |
| JP | 58-50790 | | 3/1983 |
| JP | 5-78955 | | 12/1986 |
| JP | 01035977 | * | 2/1989 |
| JP | 3-174791 | | 7/1991 |
| JP | 6-302906 | | 10/1994 |
| JP | 10-173286 | | 6/1998 |
| JP | 2000-49417 | | 2/2000 |
| JP | 2000-357842 | | 12/2000 |
| JP | 2003-324246 | A | 11/2003 |

OTHER PUBLICATIONS

K.Y. Lau, "Broad wavelength tunability in gain-levered quantum well semiconductor lasers", Appl. Phys. Lett., vol. 57, No. 25, Dec. 17, 1990, pp. 2632-2634.

European Search Report issued Sep. 5, 2007 in European Patent Application EP 04 80 7480.

Körbl, M. et al., "Electronic wavelength tuning of multisegment InGaAsP/InP lasers with laterally coupled absorptive DFB gratings", Solid-State Electronics, vol. 47, No. 4 Apr. 2003, pp. 741-745.

Kuhn, J. et al., "Dynamic Properties of GaInP Multielectrode Ridge-Waveguide Lasers", Semiconductor Science and Technology, vol. 12, No. 4, Apr. 1997, pp. 439-442.

Sheng-Hui Yang et al. "Generation of High-Power Picosecond Pulses from a Gain-Switched Two-Section Quantum-Well Laser with a Laterally Tapered Energy-Storing Section", IEEE Photonics Technology Letters, vol. 8, No. 3, Mar. 1996, pp. 337-339.

Seltzer, C.P. et al, "The Gain-Lever Effect in InGaAsP/InP Multiple Quantum Well Lasers", Journal of Lightwave Technology vol. 13, No. 2, Feb. 1995, pp. 283-289.

* cited by examiner $I_1 > I_2 > I_3 > I_4$ $I_1a > I_2a > I_3a$

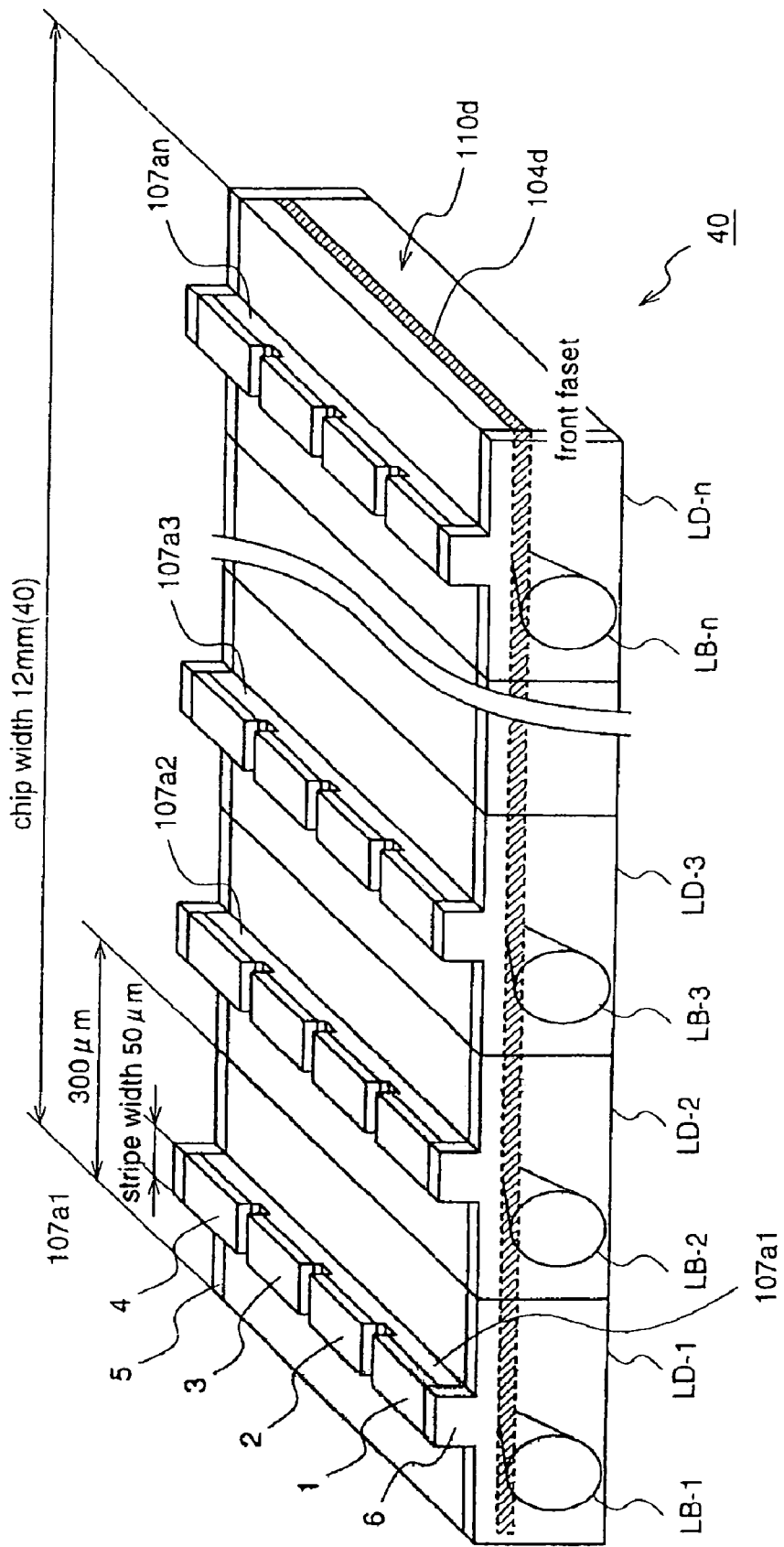

SEMICONDUCTOR LASER DEVICE AND LASER PROJECTOR

TECHNICAL FIELD

The present invention relates to a semiconductor laser device that operates stably at high output power, and more particularly, a semiconductor laser device using a III-V group nitride-base semiconductor material, and a laser projector using the semiconductor laser device.

BACKGROUND ART

With developments in optical communication and optical storage devices, demand for semiconductor lasers to be used therefor is growing, and a blue-violet semiconductor laser comprising a III-V group nitride-base semiconductor material such as gallium nitride ($Al_xGa_yIn_{1-x-y}N$; $0 \leq x \leq 1$, $0 \leq y \leq 1$) is actively developed as a key device for realizing a super high density recording on an optical disc. Particularly, increase in output power of the blue-violet semiconductor laser enables high-speed writing in an optical disc, and further, it is a technique indispensable for exploration of a new technical field such as application as a light source to a laser display which can represent bright colors using laser light of a narrow spectrum width.

FIG. 10 is a diagram illustrating an example of a conventional semiconductor laser having a current constriction structure.

The semiconductor laser 100 shown in FIG. 10 includes a semiconductor layer laminated body 110 which is obtained by successively depositing, on an upper surface of an n type GaN substrate 101, an n type AlGaN cladding layer 102, an n type GaN lightguide layer 103, an active layer 104 having a multiquantum well structure including InGaN, an undoped GaN cap layer 105, a p type GaN lightguide layer 106, and a p type AlGaN cladding layer 107.

The p type AlGaN cladding layer 107 is a ridge type cladding layer having a mesa-shaped ridge 107a, whose cross-section perpendicular to the longitudinal direction of the semiconductor laser is a convex trapezoid, and a p type GaN contact layer 108 is disposed on an upper surface of the ridge. Further, an insulating film 111 is deposited on the surfaces of the p type AlGaN cladding layer 107 and the p type GaN contact layer 108, and a p electrode 115 is disposed on the insulating film 111. The p electrode 115 is connected to the p type GaN contact layer 108 through an aperture that is formed in a portion of the insulating film 111 on the p type GaN contact layer 108, along the ridge 107a. An n electrode 116 is disposed on a lower surface of the n type GaN substrate 101.

In the semiconductor laser 100, the ridge 107a, the insulating film 111, the contact layer 108, and the p electrode 115 constitute a stripe structure for injecting current concentratedly into an optical waveguide part of the active layer 104, which is opposite to the ridge 107a. The portion of the active layer 104 opposite to the ridge 107a is an optical waveguide in which laser light is generated and guided, and both end facets perpendicular to the ridge extending direction of the optical waveguide are facets of a resonator.

In the above-described semiconductor laser, when a driving voltage is applied between the p electrode 115 and an n electrode 116, laser driving currents are injected into the active layer 104 from these electrodes. Then, the currents injected into the active layer are concentrated at the optical waveguide part of the active layer 104, which part is opposite to the ridge 107a and constitutes the resonator, and light is generated in the active layer 104. When the injected current exceeds a predetermined threshold value, laser oscillation occurs in the resonator, and laser light is emitted from the resonator facet to the outside.

In order to use the semiconductor laser thus constructed as a light source of a laser display, high output characteristic of 100 mW~several W is required. On the other hand, a semiconductor laser for a light source of a laser display is not required to have light condensing characteristic up to diffraction limit, which is required of a pickup for an optical disc. Therefore, the semiconductor laser may have a wide-stripe structure having a wide ridge, and a semiconductor laser having high-efficiency and high-output laser characteristic is required. Further, increase in the carrier density in the active layer is required for high output power of the semiconductor laser.

Generally, the stripe width is uniform over the entirety of the resonator. With an increase in the current injected from the electrodes, the carrier density in the active layer increases, and when its value reaches a constant threshold carrier density, laser oscillation occurs. The light output of the laser increases in proportion to the density of carriers which are injected into the active layer, at a current higher than the threshold current. However, when the carrier density inside the active layer is too high, saturation of the light output occurs due to gain saturation caused by spatial hole burning, whereby the high output operation is impeded. In addition, in the wide-stripe laser, although no kink occurs since the transverse mode of the waveguide light is a multimode, the shape of the transverse mode oscillation greatly changes to be unstable due to the spatial gain saturation caused by spatial hole burning. Further, in a light source for a laser display, although the light condensing characteristic up to the diffraction limit is not required as described above, when the transverse mode changes at a low frequency, the brightness of the display changes temporally, resulting in a problem that the brightness, color, and contrast cannot be accurately reproduced.

A measure to prevent the transverse mode from becoming unstable due to spatial hole burning is to narrow the stripe width. That is, as the stripe width becomes narrower, the expansion of the distribution of carriers which are injected into the active layer and the expansion in the transverse direction of the intensity distribution of the light that is induced in the active layer are relatively narrowed, and thereby, occurrence of unstable transverse mode that is caused by the spatial hole burning is prevented.

However, if the stripe width is uniformly narrowed over the entirety of the resonator, the series resistance of the element increases, and the driving voltage of the element undesirably increases. Especially, since reliability of a nitride-base semiconductor laser largely depends on the driving voltage and driving current, increase in the driving voltage must be restricted as much as possible. Further, since the light density in the waveguide increases when the stripe width is narrowed, it becomes difficult to realize high output characteristic of 100 mW or more.

In order to solve these problems, Patent Document 1 (Japanese Published Patent Application No. 2000-357842 (Pages 5-7, FIG. 1)) discloses a semiconductor laser having a taper region wherein the width of the stripe decreases from the center of the resonator toward the both end facets of the resonator. This semiconductor laser can provide laser oscillation with a stable transverse mode without excessively increasing the driving voltage for the element, as compared with the conventional laser structure in which the stripe width is uniformly narrowed.

Meanwhile, Patent Document 2 (Japanese Patent Publication No. 1862544 (Pages 2-3, FIG. 2)) discloses a semiconductor laser in which an electrode is divided into plural electrodes along an axis direction of a resonator, and voltages applied to the respective electrodes are controlled so that an injection current distribution according to a light intensity distribution of a higher light intensity is obtained in the center of the laser than in the other part of the laser, thereby realizing a semiconductor laser that achieves a stable transverse mode operation and an increased fabrication yield.

Further, Non-Patent Document 1 ("Semiconductor Laser" written and edited by Kenichi Iga, 1st edition, Ohmsha Ltd., Oct. 25, 1994, p. 238) discloses that a method of making the reflectivities at resonator facets asymmetrical is effective for high power output of a semiconductor laser. This method is common in a semiconductor laser used for writing of an optical disc, and the facets constituting the resonator is coated with dielectric films to make the reflectivity at the facets asymmetrical. To be specific, between the facets constituting the resonator, the reflectivity at the front facet from which laser light is emitted is lowered while the reflectivity at the rear facet opposite to the front facet is increased. For example, the reflectivity at the front facet is 10%, and the reflectivity at the rear facet is 90%. The reflectivity of the dielectric multi-layer can be controlled according to the refractive index of the dielectric material, the thickness thereof, and the number of layers to be laminated.

PROBLEMS TO BE SOLVED BY THE INVENTION

However, when the reflectivity at the front facet and the rear facet constituting the resonator is asymmetrical, a large bias occurs in the light intensity distribution in the resonator axis direction, inside the semiconductor laser. FIG. 11 shows an example of a light intensity distribution in the resonator axis direction in the conventional semiconductor laser shown in FIG. 10.

For example, when the reflectivities at the front facet and the rear facet are both 20%, the light intensities at the front facet and the rear facet are almost the same value. On the other hand, when the reflectivity at the front facet is 10% while the reflectivity at the rear facet is 90%, the light intensity at the front facet is about twice as high as that at the rear facet.

In this way, when the reflectivity at the resonator front facet and rear facet is asymmetrical, a large bias occurs in the light intensity distribution, as compared with the case where the reflectivity is symmetrical.

Further, in the conventional laser structure in which the stripe width of the stripe ridge shown in FIG. 10 is uniform over the entirety of the resonator, the density of carriers injected into the active layer is uniform in the resonator axis direction. Accordingly, in the semiconductor laser in which the front facet and the rear facet are coated so as to have asymmetrical reflectivity, the density of carriers injected into the active layer is uniform, although there is a large deviation in the light intensity distribution between the front facet and the rear facet.

To be specific, in a region near the rear facet, the carrier density in the active layer is excessive, resulting in a fear that kink or gain saturation might occur. This phenomenon is more remarkable in a red semiconductor laser comprising AlGaInP system semiconductor material ($Al_xGa_yIn_{1-x-y}P$ ($0 \leq x \leq 1$, $0 \leq y \leq 1$)) having a relatively high threshold carrier density or a blue semiconductor laser comprising a GaN system semiconductor material ($Al_xGa_yIn_{1-x-y}N$ ($0 \leq x \leq 1$, $0 \leq y \leq 1$)), than in an infrared semiconductor laser comprising AlGaAs system semiconductor material ($Al_xGa_{1-x}As$ ($0 \leq x \leq 1$)). Particularly, this phenomenon is prominent in its tendency in the blue semiconductor laser having the highest differential gain.

On the other hand, in the nitride-base semiconductor laser disclosed in Patent Document 1, stabilization of transverse mode is achieved by decreasing the stripe width from the center portion of the resonator toward the front facet and the rear facet of the resonator. However, when the reflectivity at the front facet of the resonator and the reflectivity at the rear facet thereof significantly differ from each other, the structure shown in Patent Document 1 cannot solve the unbalance states of the light intensity distribution and the injection carrier density distribution between the front facet and the rear facet, whereby a region where the injection carrier density is excessive is easily formed, and it is difficult to avoid this.

Furthermore, in the semiconductor laser disclosed in Patent Document 2, in order to make the current density in the center of the laser higher than that in the other part, the electrode is divided into plural electrode parts and different voltages are applied to the respective electrode parts. However, when the reflectivity at the front facet of the resonator and the reflectivity at the rear facet thereof significantly differ from each other, the semiconductor laser disclosed in Patent Document 2 cannot solve the unbalance states of the light intensity distribution and the injection carrier density distribution between the front facet and the rear facet, whereby a region where the injection carrier density is excessive is easily formed, and it is difficult to avoid this.

The present invention is made to solve the above-mentioned problems and has for its object to provide a semiconductor laser device which suppresses occurrence of a region where the injection carrier density is excessive, and performs laser oscillation with a stable transverse mode, as well as a laser projector using the semiconductor laser device as a light source.

SUMMARY OF THE INVENTION

In order to solve the above-mentioned problems, according to a first aspect of the present invention, in a semiconductor laser device including a semiconductor laser element having a ridge type cladding layer on a semiconductor substrate, the semiconductor laser element comprises a resonator for performing laser oscillation due to injection of carriers, having different reflectivities at a front facet and a rear facet, a stripe structure for injecting carriers into the resonator, extending in an axis direction of the resonator, and an electrode disposed on an upper portion of the stripe structure, and the electrode on the stripe structure is divided into two or more parts so that plural electrode parts are arranged along the resonator axis direction, and among the plural electrode parts, a current is injected into an electrode part that is positioned near the front facet of the resonator from which laser light is emitted, so as to obtain a larger current density in an active layer of the electrode part as compared with a current density in an electrode part that is positioned in the vicinity of the rear facet of the resonator.

Therefore, a mismatch between the carrier density distribution and the light intensity distribution in the laser element wherein the reflectivity at the both facets of the resonator is asymmetrical is resolved, whereby gain saturation caused by the asymmetrical light intensity distribution can be relaxed. As a result, it is possible to realize a semiconductor laser device which can perform stable transverse mode operation even at large output power.

According to a second aspect of the present invention, in the semiconductor laser device defined in the first aspect of the present invention, a transverse mode spectrum of the semiconductor laser element is in a multimode.

Therefore, occurrence of kink can be avoided.

According to a third aspect of the present invention, in the semiconductor laser device defined in the first aspect of the present invention, the semiconductor laser element has a window region that is positioned in the vicinity of the facet of the resonator.

Therefore, a reduction in reliability due to facet destruction in the high-output laser can be prevented.

According to a fourth aspect of the present invention, in the semiconductor laser device defined in the first aspect of the present invention, a voltage on which a radio frequency wave is superposed is applied to at least one of the plural electrode parts.

Therefore, it is possible to suppress return light noise due to superposition of an RF signal, while suppressing the power of the RF signal that is superposed on the injection current to the laser element, and reducing spike noise.

According to a fifth aspect of the present invention, in the semiconductor laser device defined in the fourth aspect of the present invention, a voltage on which a radio frequency wave is superposed is applied to an electrode part that is positioned in the vicinity of the rear facet of the resonator.

Therefore, the power of the RF signal superposed on the injection current to the laser element can be further suppressed.

According to a sixth aspect of the present invention, in the semiconductor laser device defined in the fourth aspect of the present invention, a voltage on which a radio frequency wave is superposed is applied to an electrode part that is positioned in the vicinity of the front facet of the resonator.

Therefore, it is possible to reduce the temporal coherence of the laser light at the light emission facet side which is easily affected by the return light, while suppressing the power of an RF signal superposed on the injection current to the laser element, and reducing spike noise.

According to a seventh aspect of the present invention, in the semiconductor laser device defined in the first aspect of the present invention, a modulated current is applied to at least one of the plural electrode parts.

Therefore, it is possible to modulate the light output of the whole semiconductor laser device by only modulating the current applied to a certain electrode part, without modulating the injection current to the whole electrode. As a result, the power consumption is suppressed, and the chirping phenomenon in which the oscillation wavelength varies due to variation in temperature can be eased.

According to an eighth aspect of the present invention, in the semiconductor laser device defined in the first aspect of the present invention, the stripe structure has a taper shape in which a stripe width at the front facet of the resonator from which laser light is emitted is larger than a stripe width at the rear facet positioned on the opposite side of the front facet.

Therefore, the light power density in a region near the light emission facet is reduced to improve the high output characteristic, and further, the reliability can be enhanced by reduction in the series resistance of the laser element.

According to a ninth aspect of the present invention, in the semiconductor laser device defined in the eighth aspect of the present invention, assuming that the resonator length is L, the stripe width at the front facet is Wf, the stripe width at the rear facet is Wr, and the stripe width in a position where a distance from the front facet is x is Wx, the stripe structure is formed so as to satisfy a relationship of $Wx = Wf - (Wf - Wr) \cdot x/L$.

Therefore, the light power density inside the resonator can be made uniform, whereby the high-output characteristic and the reliability can be further enhanced.

According to a tenth aspect of the present invention, in the semiconductor laser device defined in the ninth aspect of the present invention, the stripe structure is formed so as to have a planar shape in which a ratio of the stripe width at the front facet to the stripe width at the rear facet satisfies a relationship of 1<(stripe width at the front facet)/(stripe width at the rear facet)<2.

Therefore, expansion of the taper shape of the stripe structure is controlled to prevent multiplexing of the waveguide and increase in the scattering loss due to steep taper.

According to an eleventh aspect of the present invention, in the semiconductor laser device defined in the first aspect of the present invention, at least one electrode part among the plural electrode parts has a taper shape in which a width on the front facet side is different from a width on the rear facet side.

Therefore, the consistency between the injection carrier density distribution and the light intensity distribution can be enhanced, thereby realizing high efficiency due to reduction in carrier loss.

According to a twelfth aspect of the present invention, in the semiconductor laser device defined in the first aspect of the present invention, an electrode part close to the front facet side among the plural electrode parts has a taper shape in which a width on the front facet side is different from a width on the rear facet side.

Therefore, a mismatch between the injection carrier density distribution and the light power density distribution can be reduced in a region where the injection carrier density is high, thereby realizing high efficiency due to reduction in carrier loss.

According to a thirteenth aspect of the present invention, in the semiconductor laser device defined in the first aspect of the present invention, each of the plural electrode parts has a taper shape in which a width on the front facet side is different from a width on the rear facet side.

Therefore, a mismatch between the injection carrier density distribution and the light power density distribution can be significantly reduced, thereby realizing higher efficiency due to reduction in carrier loss.

According to a fourteenth aspect of the present invention, in the semiconductor laser device defined in the first aspect of the present invention, the stripe structure has a resistive layer formed on an upper portion thereof, and the resistive layer has a resistance value that varies from the front facet of the resonator at which laser light is emitted, to the rear facet.

Therefore, the consistency between the injection carrier density distribution and the light power density distribution can be further enhanced, thereby realizing high efficiency due to reduction in carrier loss.

According to a fifteenth aspect of the present invention, in the semiconductor laser device defined in the first aspect of the present invention, a plurality of the semiconductor laser elements are integrated on the semiconductor substrate, and separation resistive parts for separating adjacent semiconductor laser elements are formed on the semiconductor substrate.

Therefore, a large output of Watt class can be realized, and the semiconductor laser can be used as a light source for a laser display.

According to a sixteenth aspect of the present invention, in the semiconductor laser device defined in the fifteenth aspect of the present invention, at least one of the plural semiconductor laser elements oscillates laser light with a wavelength that is different from those of other semiconductor laser elements.

Therefore, the spectrum of the emitted laser light can be expanded, and speckle noise can be significantly reduced when the laser device is used as a light source for a laser display.

According to a seventeenth aspect of the present invention, in the semiconductor laser device defined in the fifteenth aspect of the present invention, at least one of the plural semiconductor laser elements is driven with an injection current that is different from those for other semiconductor laser elements.

Therefore, the spectrum of the emitted laser light can be expanded, and speckle noise can be significantly reduced when the laser device is used as a light source for a laser display.

According to an eighteenth aspect of the present invention, in the semiconductor laser device defined in the fifteenth aspect of the present invention, at least one of the plural semiconductor laser elements has a width of a stripe structure thereof that is different from widths of stripe structures of other semiconductor laser elements.

Therefore, the spectrum of the emitted laser light can be expanded, and speckle noise can be significantly reduced when the laser device is used as a light source for a laser display.

According to a nineteenth aspect of the present invention, in the semiconductor laser device defined in the first aspect of the present invention, an oscillation wavelength of laser light emitted from the semiconductor laser element is 430~455 nm.

Therefore, it is possible to realize a blue semiconductor laser in which the power consumption is reduced by reduction in required power, and the color reproducibility is improved.

According to a twentieth aspect of the present invention, in the semiconductor laser device defined in the first aspect of the present invention, the semiconductor laser element emits laser light whose vertical mode spectrum is in a multimode.

Therefore, the coherence of the laser light can be reduced, and consequently, speckle noise can be significantly reduced when the laser device is used as a light source for a laser display.

According to a twenty-first aspect of the present invention, in the semiconductor laser device defined in the first aspect of the present invention, the semiconductor laser element emits laser light whose vertical mode spectrum width expands by 1 nm or more.

Therefore, speckle noise is significantly reduced when the laser device is used as a light source for a laser display.

According to a twenty-second aspect of the present invention, there is provided a laser projector comprising a semiconductor laser device emitting laser light, and an optical system for projecting laser light emitted from the semiconductor laser device, and the semiconductor laser device is the semiconductor laser device defined in the first aspect of the present invention.

Therefore, it is possible to obtain a laser projector having, as a light source, a semiconductor laser which can achieve a large output power that is needed for a laser display, without deteriorating the stable transverse mode operation.

EFFECTS OF THE INVENTION

According to the present invention, in the semiconductor laser device having different reflectivities at the both facets of the resonator, the electrode disposed on the stripe structure for injecting carriers into the active layer is divided into plural parts, and driving voltages are applied to the respective electrode parts so that the carrier density distribution within the active layer becomes a distribution according to the light intensity distribution in the resonator direction, whereby occurrence of a region where the injection carrier density is excessively high is suppressed, resulting in a semiconductor laser device which can perform laser oscillation with a stable transverse mode.

Further, in the present invention, since the stripe structure is tapered, it is possible to resolve shortage of injection carriers at the light emission facet side of the resonator where the light intensity is high, and ease the phenomenon that the carrier density in the active layer becomes extremely high in the vicinity of the rear facet of the resonator where the light intensity is low. The increase in the light output power by making the stripe structure have the taper shape is particularly effective in a gallium nitride system semiconductor laser having a high threshold carrier density and a high differential gain.

BRIEF DESCRIPTION OF THE DRAWINGS

FIG. 7 is a perspective view for explaining a semiconductor laser device according to a fourth embodiment of the present invention.

DESCRIPTION OF REFERENCE NUMERALS

Figure 1:
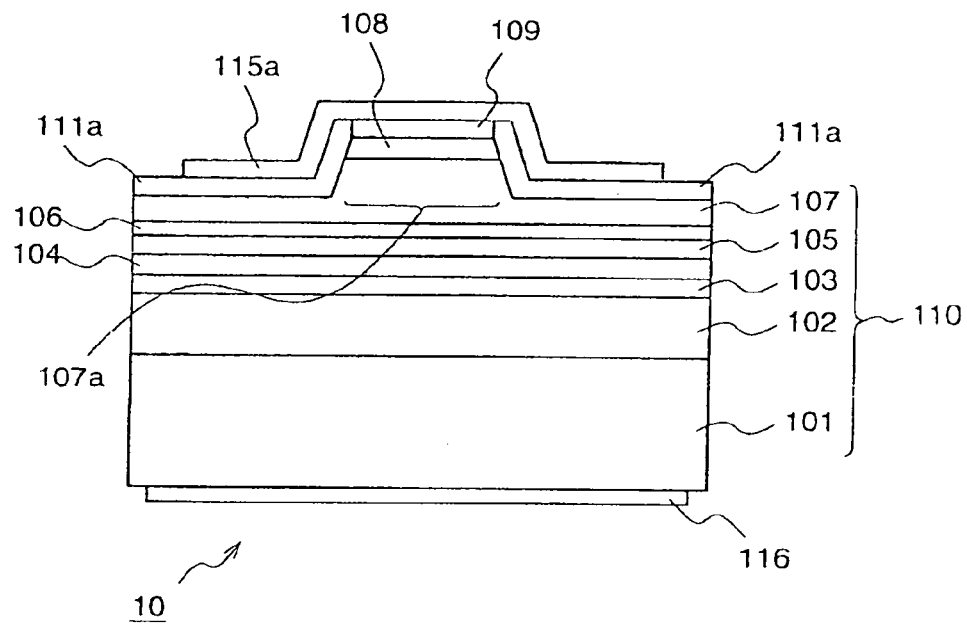
FIG. 1 is a cross-sectional view illustrating a fundamental structure of a semiconductor laser device according to embodiments of the present invention.

1~4,1a~3a,1b~3b,1c~3c . . . electrode parts
5 . . . rear facet side reflection film
6 . . . front facet side reflection film
7 . . . separation resistive part
10,10a,10b,20,30,30a,30b,40,100 . . . semiconductor laser devices
11~14 . . . power supplies
23,24 . . . RF power supplies
33,34 . . . modulators
50 . . . laser projector
101 . . . n type GaN substrate
102 . . . n type AlGaN cladding layer
103 . . . n type GaN lightguide layer
104,104d . . . active layer comprising a multi-quantum-well structure including InGaN
105 . . . undoped GaN cap layer
106 . . . p type GaN lightguide layer
107 . . . p type AlGaN cladding layer
107a,107b,107c,107a1~107an . . . ridges
108 . . . p type GaN contact layer
109 . . . p metal layer
110,110d . . . semiconductor layer laminated bodies
111,111a . . . insulating layers
115,115a~115c . . . p electrodes
116 . . . n electrode
201a . . . red semiconductor laser source
201b . . . green laser source
202a~202c . . . beam expanders
203a~203c . . . light integrators
204a~204c . . . condenser lenses
205a~205c . . . field lenses
206a~206c . . . diffusers
207a~207c . . . spatial light modulators
208a~208c . . . diffuser vibration means
209 . . . dichroic prism
210 . . . projection lens
211 . . . screen
212a,212c . . . mirrors
225a,225c . . . RF supplies
LB-1~LB-n . . . laser beams
LD-1~LD-n . . . semiconductor laser elements

DETAILED DESCRIPTION OF PREFERRED EMBODIMENTS

Hereinafter, semiconductor laser devices according to embodiments of the present invention will be described in detail with reference to the drawings.

Embodiment 1

A semiconductor laser device according to a first embodiment of the present invention is a facet-emitting type semiconductor laser having a stripe structure for performing current constriction, in which a light reflectivity at a front facet from which light is emitted is different from a light reflectivity at a rear facet opposite to the front facet. An electrode disposed on the stripe structure is divided into plural electrode parts, and laser driving currents are applied to the respective electrode parts so that the density of current injected into an active layer becomes large at the front facet side and small at the rear facet side.

The semiconductor laser according to the first embodiment is applicable as a light source for an optical pickup or a laser display.

Hereinafter, the first embodiment will be described in detail.

Initially, a description will be given of a fundamental element structure of the semiconductor laser device according to the first embodiment.

FIG. 1 is a cross-sectional view for explaining a fundamental element structure of the semiconductor laser according to the first embodiment of the present invention, illustrating a specific structure at a cross-section perpendicular to the resonator length direction.

The semiconductor laser device 10 according to the first embodiment is obtained by forming a nitride semiconductor laser element comprising III-V group nitride-base semiconductor materials on a semiconductor substrate.

Figure 10:
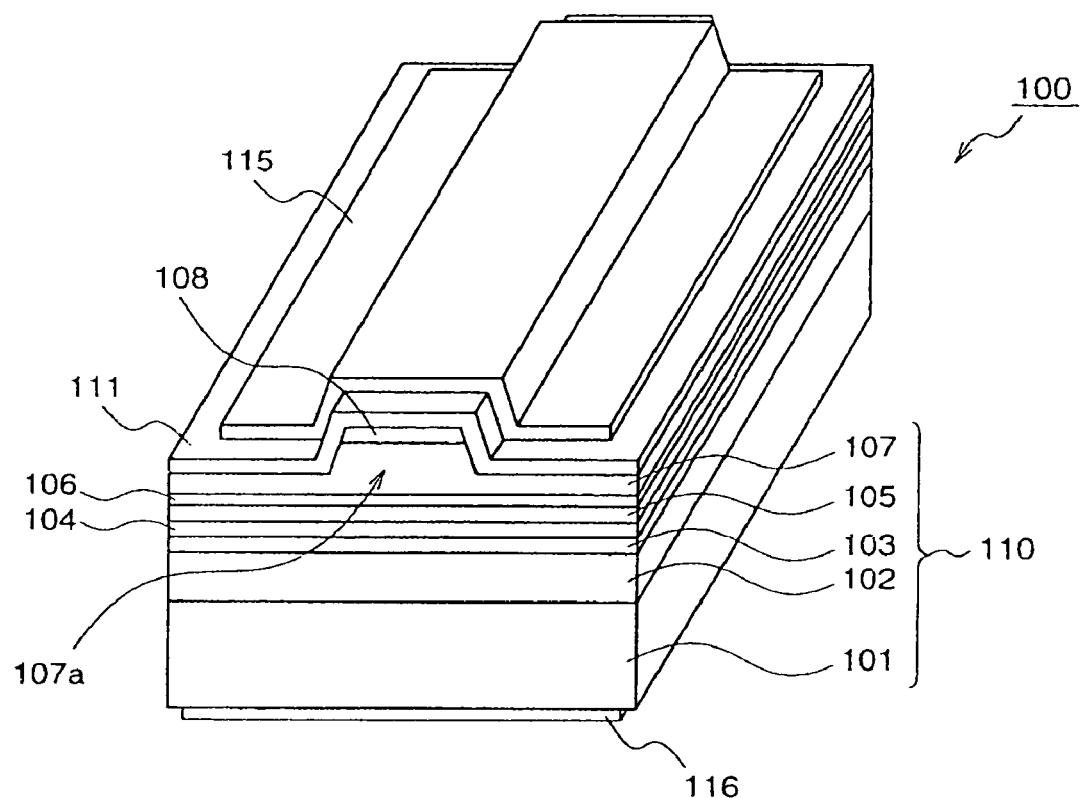
FIG. 10 is a schematic diagram illustrating an example of a conventional semiconductor laser.
Figure 11:
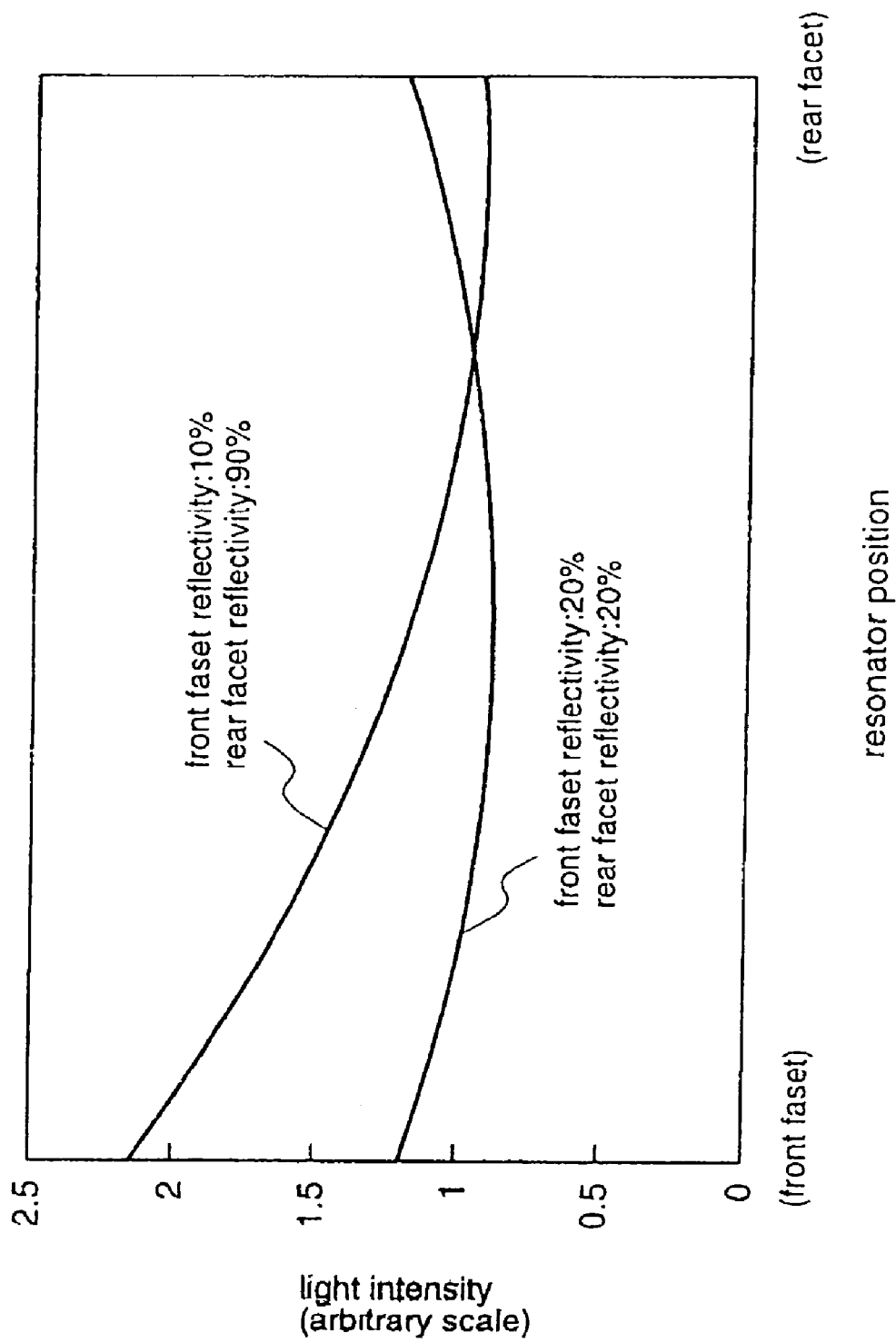
FIG. 11 is a diagram illustrating an example of a light intensity distribution in an axis direction of a resonator in the conventional semiconductor laser shown in FIG. 10.

To be specific, the semiconductor laser device 10 includes a semiconductor layer laminated body 110 which is obtained by successively depositing, on an upper surface of an n type GaN substrate 101, an n type AlGaN cladding layer 102, an n type GaN lightguide layer 103, an active layer 104 having a multiquantum well structure including InGaN, an undoped GaN cap layer 105, a p type GaN lightguide layer 106, and a p type AlGaN cladding layer 107, like the conventional semiconductor laser 100 shown in FIG. 10.

The p type AlGaN cladding layer 107 is a ridge type cladding layer having a mesa-shaped ridge 107a, whose cross-section perpendicular to the longitudinal direction of the laser is a convex trapezoid, and a p type GaN contact layer 108 is disposed on an upper surface of the ridge 107a.

In the semiconductor laser device 10 according to the first embodiment, a p metal layer 109 is disposed on the p type GaN contact layer 108 on the ridge 107a of the cladding layer 107, and further, an insulating film 111a is disposed on the cladding layer 107 so that the surface of the p metal layer 109 is exposed. Further, a p electrode 115a is disposed on the insulating film 111a so as to contact the p metal layer 109 on the ridge 107a, and an n electrode 116 is disposed on a rear surface of the n type GaN substrate 101.

In the semiconductor laser device 10 of the first embodiment, a stripe structure into which current is concentratedly injected is formed in portions of the ridge 107a, the contact layer 108, the p metal layer 109, the insulating film 111a, and the p electrode 115a, which positions constitute the resonator. Further, a portion of the active layer 104, opposite to the ridge 107a, is an optical waveguide in which laser light is generated and guided, and both facets of the optical waveguide perpendicular to the ridge extending direction are resonator facets.

Next, a method for fabricating the semiconductor laser device will be described.

Initially, the n type AlGaN cladding layer 102, the n type GaN lightguide layer 103, the active layer 104 comprising the multiquantum well structure including InGaN, the undoped GaN cap layer 105, the p type GaN lightguide layer 106, the a p type AlGaN cladding layer 107, and the p type GaN contact layer 108 are successively grown on the n type GaN substrate 101 using metal-organic chemical vapor deposition (MOCVD).

Next, the p type GaN contact layer 108 and the p type AlGaN cladding layer 107 are processed by selective dry etching to fabricate the stripe-shaped mesa type ridge 107a. Thereafter, the insulating film 111a is formed over the entire surface of the semiconductor laser laminated body 110 so that the contact layer 108 on the stripe ridge 107a is exposed.

Then, the p metal layer 109 is selectively formed on the contact layer 108 on the stripe ridge 107a, and thereafter, the p electrode 115a is formed on the insulating film 111a and on the contact layer 108, and the n electrode 116 is formed on the rear surface of the semiconductor substrate 101.

In the semiconductor laser device 10 of this first embodiment, the resonator length, chip width, and thickness of the laser element are 600 μm, 400 μm, and 80 μm, respectively. The resonator facets of the laser element are coated with dielectric films 6 and 5, respectively, and the reflectivity at the front facet from which laser light is emitted and the reflectivity at the rear facet opposite to the front facet are 10% and 90%, respectively.

Next, the structure of the p electrode 115a of the semiconductor laser device will be described.

Figure 2A:
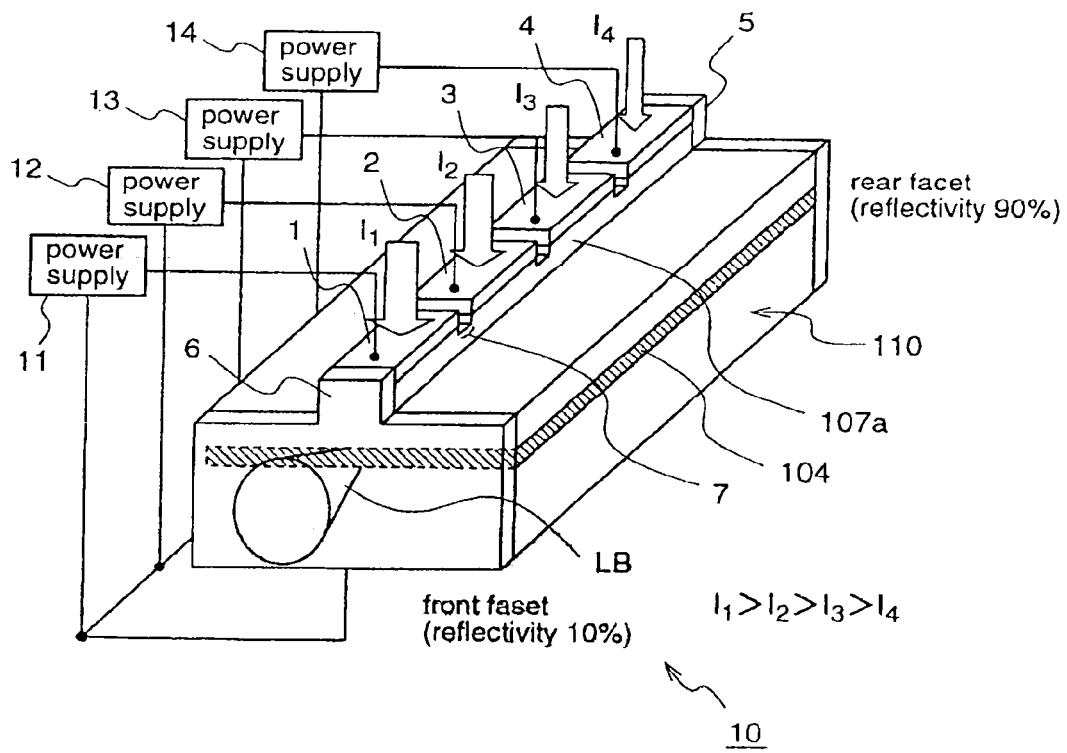
FIG. 2(a) is a perspective view schematically illustrating a semiconductor laser device according to a first embodiment of the present invention.

FIG. 2(a) is a perspective view schematically illustrating the electrode structure of the semiconductor laser device of the first embodiment, wherein the p electrode disposed on the upper surface of the laser element is divided into four parts. In FIG. 2(a), the semiconductor layers other than the active layer 104, which are the constituents of the semiconductor layer laminated body 110 of the semiconductor laser device 10, are omitted. As for the p electrode 115a shown in FIG. 1, only a substantial electrode region thereof, i.e., only a portion positioned on the stripe ridge 107a, is shown.

In the semiconductor laser device 10, a resonator performing laser oscillation is formed in a portion of the active layer 104, opposite to the stripe ridge 107a. The p electrode 115a disposed on the stripe ridge 107a is divided into four parts, and the respective electrode parts 1~4 are arranged along the resonator length direction, and connected to power supplies 11~14, respectively.

Further, a separation resistive part 7 is disposed between adjacent electrode parts, and prevents a sneak current between these electrodes. The separation resistive part 7 is formed by etching a portion of the strip ridge 107a between the adjacent electrode parts, from the surface of the p metal layer 109 to the inside of the p type AlGaN cladding layer 107. The separation resistive part 7 may be provided with a current blocking layer to ensure resistance separation. This current blocking layer can be formed by increasing the resistance of a surface region between the adjacent electrode parts by ion injection or the like.

The respective power supplies 11~14 apply driving voltages to the respective electrode parts so that the magnitudes I1, I2, I3, and I4 of currents injected into the respective electrode parts 1, 2, 3, and 4 satisfy the relationship of I1>I2>I3>I4. That is, the driving voltages supplied from the power supplies 11, 12, 13, and 14 to the respective electrode parts 1~4 are set such that the injected current from the electrode part on the emission end facet side of laser light Lb is larger than the injected current from the electrode part on the rear end facet side opposite to the emission end facet.

The width of the strip ridge 107a is about 50 μm, and the length thereof is 1 mm. In this semiconductor laser device, the light reflectivity at the front facet as the light emission facet is 10%, and the light reflectivity at the rear facet opposite to the front facet is 90%.

Further, the semiconductor laser device 10 has a facet window structure, thereby to prevent reduction in laser reliability due to facet destruction in a high output laser. The facet window structure can be fabricated by deactivating the active layer near the resonator facet so that no light generation occurs. A facet window structure may be fabricated by providing a current blocking layer on an upper portion of the p type cladding layer in the vicinity of the resonator facet to prevent current from flowing into a portion of the active layer in the vicinity of the resonator facet.

Next, the function and effect will be described.

In the semiconductor laser 10, when driving voltage is applied between the p electrode 115a and the n electrode 116, current is injected into the active layer 104 from these electrodes. At this time, the current injected into the active layer concentrates to a portion of the active layer 104, opposite to the ridge 107a, and light is generated in this portion. When the injected current exceeds a predetermined threshold value, laser oscillation occurs in the resonator having this emission region as an optical waveguide, and laser light LB is emitted from the resonator facet to the outside. At this time, driving voltages are applied to the four electrode parts 1~4 constituting the p electrode 115a so that a larger magnitude of current is injected into the electrode part closer to the laser light LB emission facet.

The semiconductor laser device thus constructed is characterized by that laser light of high output power can be taken out.

Hereinafter, the characteristic of the semiconductor laser device according to the first embodiment will be described in comparison with the characteristic of the conventional laser device.

Figure 3A:
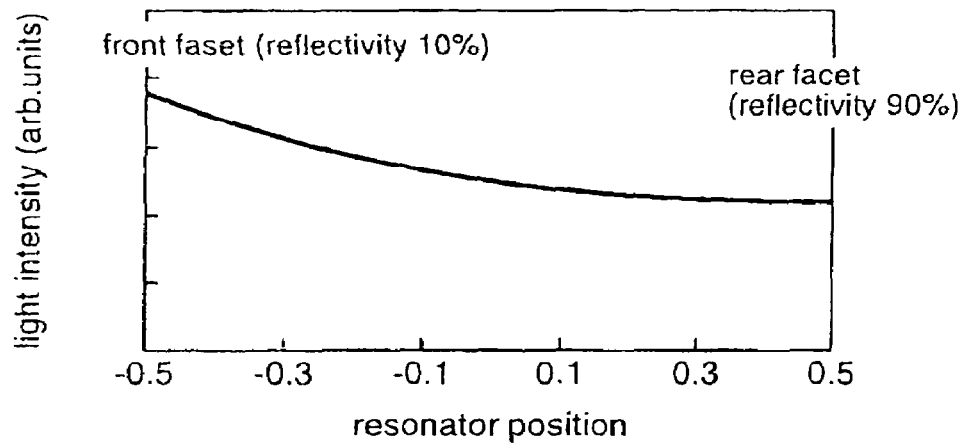
FIG. 3(a) is a diagram illustrating an example of a light intensity distribution in an axis direction of a resonator as a constituent of the semiconductor laser of the first embodiment.

Generally, high output characteristic of 100 mW or more is required of applications to a light source for high-speed writing into an optical disc, a light source for a display, and the like. In order to realize the high output characteristic, asymmetry of reflectivity at laser facets is effective. In the conventional semiconductor laser device, by making the facet reflectivity asymmetrical, the light power density in a region near the facet on the low-reflectivity side is increased as shown in FIG. 3(a), thereby to realize high output characteristic. However, when the injection current is increased to obtain a higher power, the light density in a portion of the active layer near the rear facet is increased, whereby hole burning occurs in the axis direction of the resonator, leading to reduction in gain and unstable transverse mode. Accordingly, an increase in the injection current causes a reduction in output power and instability. On the other hand, in a portion of the active layer near the light emission facet, a shortage of injection carriers occurs due to an increase in the light power density.

Figure 3B:
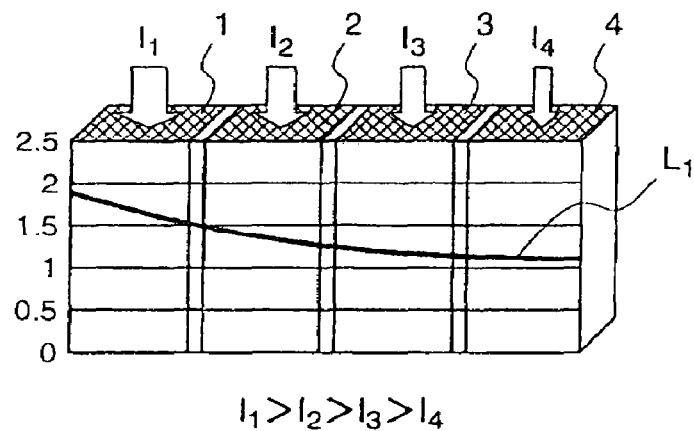
FIG. 3(b) is a diagram illustrating the magnitude correlations of currents applied to divided four electrodes which are constituents of the semiconductor laser of the first embodiment.

On the other hand, in the semiconductor laser device according to the first embodiment, since the carrier density distributions at the light emission facet and the rear facet opposite to the light emission facet are adjusted according to the light intensity distribution, a stable output can be obtained during high output operation. That is, the electrode structure is divided into parts to enable control of the current injection density in accordance with the light power density distribution. For example, as shown in FIG. 3(b), the magnitudes I1, I2, I3, and I4 of currents injected into the respective electrode parts 1~4 into which the p electrode is divided are set so as to satisfy the relationship of I1>I2>I3>I4, whereby carrier injection in accordance with the light power density distribution can be carried out. Especially, it is effective to increase the current density in the electrode part in the vicinity of the light emission facet.

The number of electrode parts into which the p electrode is divided is not restricted to four. It may be two or more, and preferably, it should be three or four.

Further, the intensity distribution of the injection current is desired to be a distribution according to the light power density distribution shown in FIG. 3(a).

For example, FIG. 3(b) shows the light intensity distribution and the magnitude of the injection current in the case where the p electrode is divided into four parts. In this case, as shown in FIG. 3(b), the injection currents I1, I2, I3, and I4 from the respective electrode parts 1~4 should be preferably set so that the injection current intensity distribution matches the light power density distribution L1.

Figure 3C:
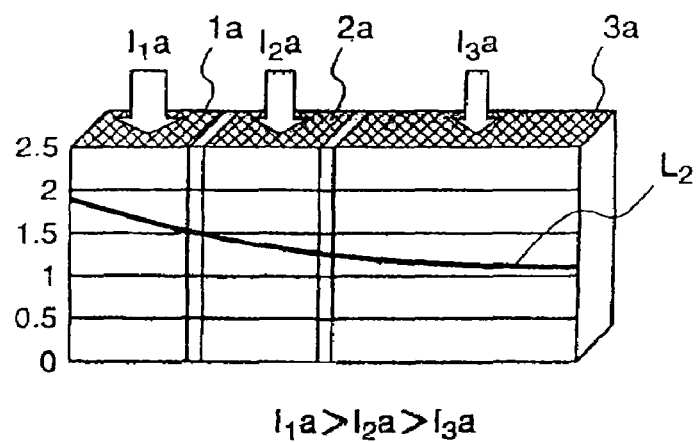
FIG. 3(c) is a diagram illustrating the magnitude correlations of currents applied to divided three electrodes, in the case where the electrode of the semiconductor laser according to the first embodiment is divided into three parts.

FIG. 3(c) shows the light intensity distribution and the magnitude of the injection current in the case where the p electrode is divided into three parts. In this case, as shown in FIG. 3(c), an electrode part 3a which is close to the rear facet on the opposite side from the light emission facet is made longer than other electrodes 1a and 2a, in accordance with the light power density distribution L2, and the densities I1a, I2a, and I3a of the currents injected from the respective electrode parts 1a~3a are set so that the electrode part closer to the light emission facet has a higher current density. That is, in this case, the densities I1a, I2a, and I3a of the currents injected from the electrode parts 1a~3a satisfy the relationship of I1a>I2a>I3a.

Further, when the p electrode is divided into two parts, the length of an electrode part on the light emission facet side is made shorter than the length of the other electrode part on the rear face side, in accordance with the light power density distribution shown in FIG. 3(a), and the density of the injection current from the electrode part on the light emission facet side is made higher than the density of the injection current from the other electrode part on the rear facet side, whereby the injection current density distribution can be approximated to the light power density distribution.

Thereby, in the region of the high power density in the vicinity of the light emission facet where unstable transverse mode easily occurs due to hole burning, occurrence of the unstable transverse mode can be significantly suppressed, resulting in high power output. Particularly when the p electrode is divided into three or more parts, the injection current density distribution can be closer to the light power density distribution. However, when the p electrode is divided into six or more, the length of the whole laser electrode, which is the total of the lengths of the electrode parts and the separation resistive parts, becomes too long, and therefore, it is not very much desirable in view of the yield.

Further, the asymmetrical reflectivity structure of the semiconductor laser element in which the reflectivity differs between the light emission facet and the rear facet opposite to the light emission facet is important for high output characteristic. By reducing the reflectivity at the light emission facet, the light power density distribution shown in FIG. 3(a) is realized, and light of high output power can be efficiently taken out. In order to realize this high output characteristic, preferably, the reflectivity at the light emission facet should be 1~20%, and the reflectivity at the rear facet should be 60~100%. More preferably, the reflectivity at the light emission facet should be 3~10%, and the reflectivity at the rear facet should be 80~100%. When the reflectivities at the light emission facet and the rear facet are set at 5±2% and 95±5%, respectively, the highest output characteristic can be achieved. Further, even when a semiconductor laser other than the GaN system laser, for example, a semiconductor laser using an AlGaAs system semiconductor material or an AlGaInP system semiconductor material, is adopted, a semiconductor laser performing stable operation and having high output characteristic can be obtained by adopting the electrode division structure.

Next, a description will be given of the structure for preventing occurrence of noise due to return light, in the semiconductor laser according to the first embodiment.

The return light noise is a phenomenon that noise is significantly increased due to return of the light emitted from the semiconductor laser back to the active layer. In order to avoid this phenomenon, a method of reducing the coherence of light is usually adopted. For example, there is adopted a method of superposing an RF signal of several 100 MHz on the driving current. In the high-output semiconductor laser, however, increase in the driving current causes significant increase in required RF power. The increase in the RF power leads to increase in power consumption, and further, the cost of the whole system is significantly increased because of countermeasures for heat release and radiation.

On the other hand, the semiconductor laser device according to the first embodiment can resolve the problem of RF superposition in the high output laser.

To be specific, the RF superposition method is a method for temporally changing the light oscillation state by changing the state of the carrier density of the semiconductor laser, thereby to reduce the temporal coherence. Accordingly, the rate of change with respect to the density of carriers injected into the active layer is important. In the conventional semiconductor laser device having the single electrode structure, the injected current disperses over the whole electrode. Therefore, in order to largely change the carrier density, it is necessary to increase the ratio of current to be changed at a high frequency, to the injected current, leading to undesirable increase in the RF amplitude of the RF superposition.

On the other hand, in the semiconductor laser device according to the first embodiment, it is possible to superpose an RF signal on only a specific electrode part.

Figure 2B:
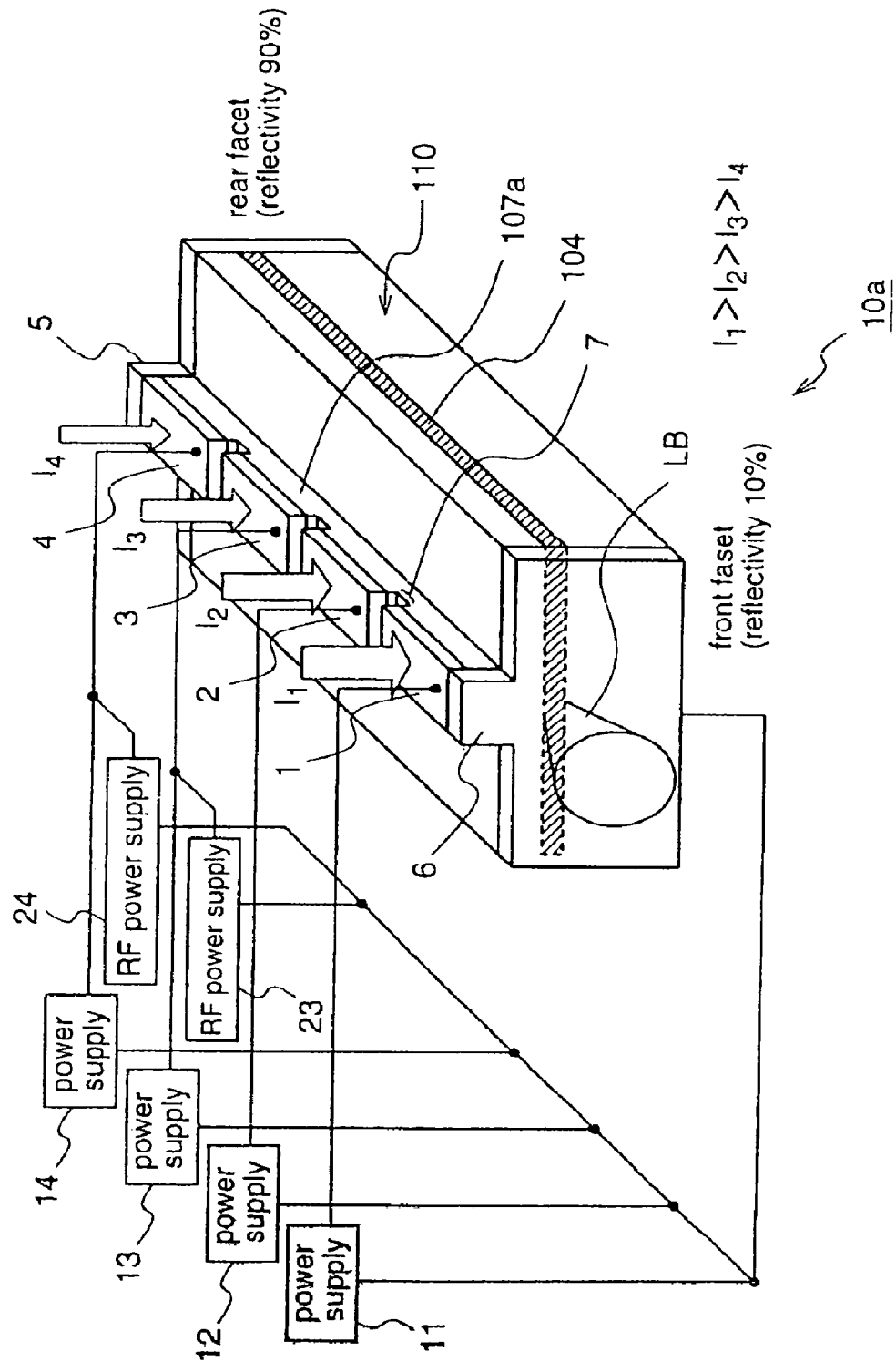
FIG. 2(b) is a diagram for explaining an example of performing RF superposition onto a driving current of the semiconductor laser device according to the first embodiment.

For example, FIG. 2(b) shows an example of a semiconductor laser device 10a in which RF power supplies are connected to only some of the four divided electrode parts in the semiconductor laser device of the first embodiment. That is, an RF power supply 23 is connected to the electrode part 3 while an RF power supply 24 is connected to the electrode part 4, and RF signals are superposed to these electrode parts 3 and 4.

In the semiconductor laser device according to the first embodiment, since the p electrode is divided into four parts, injection current from each electrode part is significantly reduced as compared with the injection current from the p electrode that is not divided. That is, since the current amplitude of the RF signal superposed on a certain electrode part among the divided plural electrode parts can be reduced to a fraction of the current amplitude of the RF signal superposed on the signal electrode, the power of the RF superposition can be significantly reduced. Further, even when the RF signal is superposed on only the certain electrode part, sufficient variation in the carrier density can be obtained in the active layer beneath the electrode part, whereby the oscillation state of the whole resonator changes to reduce the temporal coherence.

Further, in the semiconductor laser device according to the first embodiment, in order to obtain the output as shown in the light intensity distribution diagram of FIG. 3(a), it is necessary to increase the injection current from the electrode part in the vicinity of the light emission side facet. However, only low current according to the light power density is required as injection current from the electrode part on the rear facet side. Therefore, the coherence can be efficiently reduced at a low RF power by superposing an RF signal on the injection current from the electrode part in the vicinity of the rear facet, thereby realizing miniaturization, cost reduction, and reduction in power consumption of the system.

Further, the electrode division structure adopted in the semiconductor laser device according to the first embodiment is particularly effective to a GaN laser, and hereinafter, the reason therefor will be described.

Usually, in a semiconductor laser having a GaN substrate as a base, relaxation oscillation is great and therefore spike noise occurs when RF superposition is carried out. The spike noise is a phenomenon that the waveform of output light varies spike-wise due to relaxation oscillation when the current injected into the semiconductor laser is modulated with an RF wave, resulting in a pulse output that is many times higher than the modulation degree. In a conventional optical disc system using a GaN laser, in order to prevent noise in the laser from increasing due to return light during playback of the optical disc, an RF wave of several 100 MHz is superposed on the laser. However, a spike-shaped output having a high peak value is outputted even when the average power during playback is low, and this spike-shaped output causes a problem of degradation in playback light, by which recorded data are degraded during playback.

On the other hand, in the semiconductor laser device according to the first embodiment, since the electrode is divided into plural parts and an RF wave of about 100 mA is superposed on some of the electrode parts, the peak value in the spike-shaped output can be significantly reduced to half or less, with the return light noise of the laser being reduced. Further, when the RF superposition method is adopted to reduce the return light noise, it is desirable to apply an RF signal to the electrode part positioned near the light emission facet. That is, the return light noise can be reduced, and the spike noise can be significantly reduced by applying the RF signal to the electrode part positioned near the light emission facet which is most affected by the return light. Therefore, the semiconductor laser device according to the first embodiment is preferably applied to an optical disc device or the like. Further, the semiconductor laser device according to the first embodiment may be a laser other than the GaN system laser, for example, a semiconductor laser using an AlGaAs system semiconductor material or an AlGaInP system semiconductor material. Also in this case, it is possible to efficiently apply the RF signal.

Further, the electrode division structure of the semiconductor laser device according to the first embodiment plays an effective role in modulating the laser output.

Presently, when modulating an output of a semiconductor laser, an injection current to the entire laser is modulated at a predetermined degree of modulation in a range from 0% to 100%. However, when the injection current to the semiconductor laser is varied, a chirping phenomenon occurs, in which the temperature of the semiconductor laser increases due to increase in power consumption and thereby the oscillation wavelength varies. For example, when performing recording of data onto media such as an optical disc, the recording is carried out while modulating a light source. At this time, if the wavelength of the light source varies due to chirping, the size of a focus spot undesirably varies due to chromatic aberration. This phenomenon is particularly remarkable in a short wavelength region where the dispersion characteristic of the optical system is remarkable.

On the other hand, in the semiconductor laser device according to the first embodiment, it is possible to modulate the light output from the entire laser by modulating the injection current from some of the electrode parts.

Figure 2C:
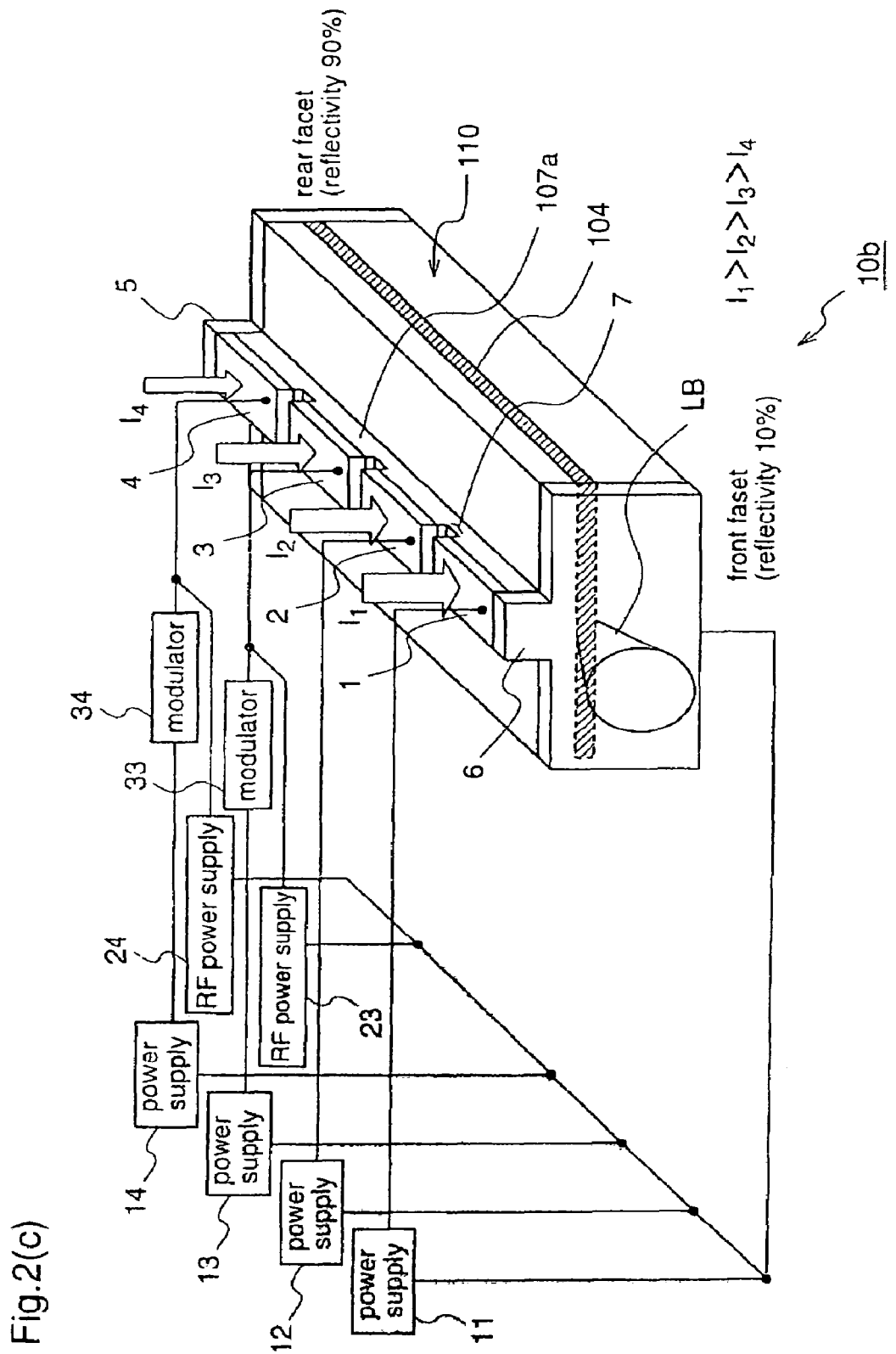
FIG. 2(c) is a diagram for explaining an example of performing current modulation on a driving current of the semiconductor laser device according to the first embodiment.

For example, FIG. 2(c) shows an example of a semiconductor laser device 10b which is obtained by inserting modulators between certain electrode parts and the corresponding power supplies in the semiconductor laser device 10a shown in FIG. 2(b).

In FIG. 2(c), a modulator 33 is inserted between the electrode part 3 and the power supply 13, and a modulator 34 is inserted between the electrode part 4 and the power supply 14, and currents supplied from the power supplies 13 and 14 to the electrode parts 3 and 4 are modulated. In this way, by modulating the power supply currents applied to some of the electrode parts, change in the current value in the entire semiconductor laser device is reduced, and consequently, chirping is reduced to be several nm or less. The semiconductor laser device 10b thus constructed is preferably applied to a light source of an optical disc pickup.

As described above, according to the first embodiment, in the semiconductor laser device of the asymmetrical reflectivity structure in which the light reflectivity at the light emission facet is different from the light reflectivity at the facet opposite to the light emission facet, the electrode disposed on the stripe-shaped ridge is divided into plural electrode parts, and the injection current from the electrode part closer to the light emission facet has the higher injection current density. Therefore, the carrier density distribution in the active layer corresponds to the light intensity distribution in the active layer, thereby realizing a high-output semiconductor laser capable of performing laser oscillation with a stable transverse mode.

Further, in the first embodiment, since RF signals are superposed on only certain electrode parts among the divided plural electrode parts, a change in the carrier density due to the RF can be realized with less current amplitude, thereby realizing miniaturization, cost reduction, and reduction in power consumption of the system. For example, when the RF superposition is performed to the electrode part on the rear facet side, the current density of the RF wave to be superposed can be further reduced. Further, when the RF superposition is performed to the electrode part on the front facet side, reduction in return light noise and reduction in spike noise can be effectively achieved.

Further, in the first embodiment, since the currents to be injected into the certain electrode parts among the divided plural electrode parts are modulated, modulation of the laser output can be carried out while suppressing chirping.

While in the semiconductor laser device of the first embodiment a semiconductor laser element having a cross-sectional structure shown in FIG. 1 is described, the cross-sectional structure of the semiconductor laser element may be identical to that of the conventional semiconductor laser shown in FIG. 10.

Embodiment 2

Figure 4:
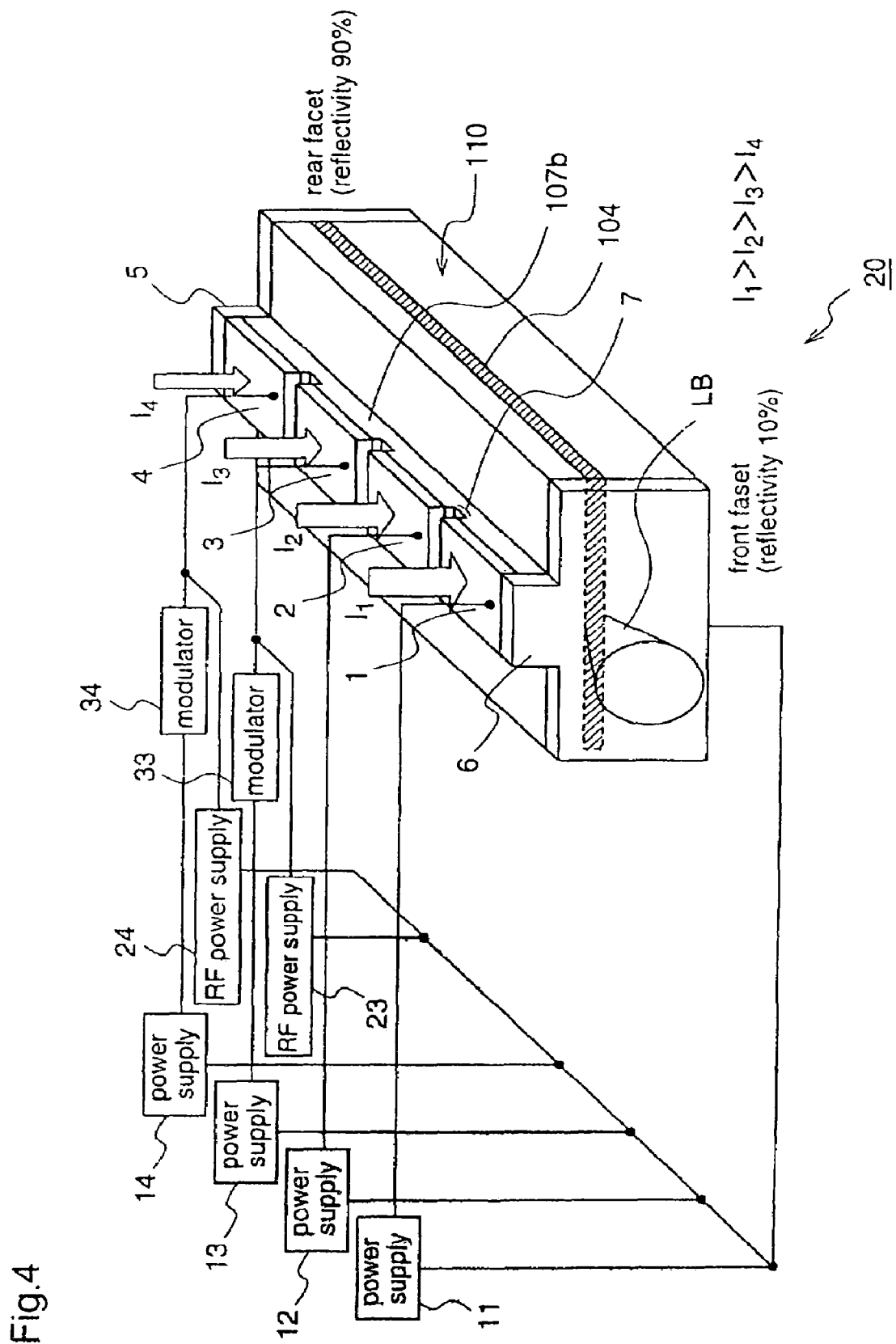
FIG. 4 is a perspective view schematically illustrating a semiconductor laser device according to a second embodiment of the present invention.

FIG. 4 is a diagram for explaining a semiconductor laser device according to a second embodiment of the present invention.

The semiconductor laser device 20 according to the second embodiment is a high output semiconductor laser device of a wide-stripe structure, which is obtained by increasing the width of the stripe ridge 107a in the semiconductor laser device 10b of the first embodiment shown in FIG. 2(c), and it is utilized as a light source for a laser display.

That is, the semiconductor laser device 20 of this second embodiment has a semiconductor layer laminated body 110 which is obtained by successively depositing, on an n type GaN substrate, an n type AlGaN cladding layer, an n type GaN lightguide layer, an active layer having a multiquantum well structure including InGaN, an undoped GaN cap layer, a p type GaN lightguide layer, and a p type AlGaN cladding layer, like the semiconductor laser device 10 according to the first embodiment.

In this second embodiment, a stripe ridge 107b formed at the surface of the semiconductor layer laminated body 110 has a larger width than that of the first embodiment, and a resonator performing laser oscillation is formed on a portion of the active layer 104, which is opposed to the strip ridge 107b. Further, a p electrode which is divided into four parts is disposed on the stripe ridge 107b, and a separation resistive part 7 is formed between the adjacent electrode parts, like the semiconductor laser device of the first embodiment. The plural electrode parts 1~4 constituting the p electrode are arranged along the resonator length direction, and are connected to power supplies 11~14, respectively.

Further, in the semiconductor laser device 20 of this second embodiment, among the plural electrode parts, an RF power supply 24 is connected to the electrode part 4 closest to the rear facet, and an RF power supply 23 is connected to the electrode part 3 next to the electrode part 4, whereby RF signals of different frequencies are superposed on the currents injected into these electrodes. Further, a modulator 33 is inserted between the electrode part 3 and the power supply 13, and a modulator 34 is inserted between the electrode part 4 and the power supply 14, whereby the currents supplied from the power supplies 13 and 14 to the electrode parts 3 and 4 are modulated.

Next, the function and effect will be described.

A laser display is a display device using an RGB laser, and a large output of several 100 mW~several W is required as a laser output. However, since the laser display is not required to have light condensing up to diffraction limit of light, the transverse mode of the semiconductor laser is not necessarily a single mode.

Therefore, the semiconductor laser device 20 of this second embodiment adopts the wide stripe structure.

Also in this wide stripe structure, however, a sufficient carrier density in accordance with the light power distribution in the waveguide is required. Especially in a region near the light emission facet, shortage of carriers occurs due to increase in the light power density and thereby the oscillation state of the transverse mode becomes unstable, leading to deterioration of the high output characteristic. Therefore, it is necessary to optimize the injection current density distribution also in the semiconductor laser having the wide stripe structure.

Further, in addition to the above-mentioned output characteristic, the following characteristics are required of the light source of the laser display.

Firstly, wavelength stability is required. Since, especially in a red laser, visibility changes significantly due to wavelength change, the wavelength change must be suppressed within ±1 nm.

Secondly, reduction in speckle noise is required. In order to reduce speckle noise, reduction in coherence is important, and the wavelength spectrum must be expanded to several nm.

In the semiconductor laser device according to the second embodiment solves the above-mentioned two problems, and hereinafter, it will be described in comparison with the conventional device.

Initially, wavelength stability will be described.

When projecting an image by laser light, it is necessary to modulate the laser output intensity in accordance with gradient. At this time, the mode stability and the wavelength change as well as the output intensity must be considered. That is, when projecting an image by laser light, although the laser light must be modulated to a value ranging from 100 mW to several mW, the laser wavelength undesirably changes with the laser output intensity. Further, in the conventional high output semiconductor laser, the driving current significantly differs between at high output and at low output, leading to chirping in which the oscillation wavelength significantly varies due to a in the temperature of the laser.

On the other hand, in the semiconductor laser device 20 according to the second embodiment, since the current applied to some of the divided plural electrode parts is modulated, variation in the injection current can be reduced, and consequently, stable modulation with less wavelength variation can be carried out. Further, since the p electrode is divided into part so that the injection current density has a distribution in the resonator length direction, the transverse mode is stabilized and thereby the gradient is increased.

Next, a description will be given of expansion of the wavelength spectrum to reduce spectrum noise.

Since the light source for a laser display requires high output characteristic, RF superposition under the state where the average output is kept at 100 mW and more is required.

Accordingly, in the conventional semiconductor laser device, it is necessary to perform RF superposition under the state where current of several 100 mA is injected, and thereby a structure for applying an RF wave having a current amplitude of several 100 mA is needed. Therefore, enormous power consumption and a high-power RF circuit are needed, and further, reduction in external radiation is also needed.

On the other hand, in the semiconductor laser device 20 according to the present invention, since an RF wave is superposed on the current applied to some of the divided plural electrode parts, the RF current can be reduced. Further, in a portion of the active layer near the rear facet, the required current density is low because the light intensity density is low, and accordingly, the injection current can be reduced. As a result, the amplitude of the RF superposition that depends on the injection current can be significantly reduced by performing superposition of RF current onto the injection current from the electrode part close to the rear facet, thereby realizing simplification, miniaturization, and reduction in power consumption of the system.

Next, a description will be given of prevention of speckle noise by further reduction in coherence.

Reduction in the coherence is proportional to increase in the spectrum width. That is, the speckle noise can be further reduced by largely increasing the spectrum width. So, it is effective to increase the power of the RF superposition to be applied to the driving current of the semiconductor laser, but spectrum expansion by increase in power is limited to several nm in wavelength.

On the other hand, in the semiconductor laser device 20 according to the present invention, among the divided plural electrode parts, the electrode part 3 closest to the rear facet and the electrode part 4 next to the electrode part 3 are supplied with RF waves of different frequencies.

For example, when RF waves having different frequencies such as 500 MHz and 400 MHz are applied to the different two electrode parts, relative disturbance of the laser oscillation state between the both electrodes is increased, whereby spread of the spectrum is increased. At this time, spread of the spectrum can be 1.2~1.5 times as large as that in the case where an RF wave is applied to a single electrode, although it depends on the frequency. The semiconductor laser device 20 according to the second embodiment is particularly effective to coherence reduction in light of high output power not less than 100 mW.

As described above, according to the second embodiment, in the wide-stripe structure semiconductor laser device in which the light reflectivity at the light emission facet is different from the light reflectivity at the opposite facet, the electrode disposed on the stripe ridge is divided into plural parts, and the electrode part closer to the light emission facet has a higher density of the corresponding injection current. Therefore, the carrier density distribution in the active layer corresponds to the light intensity distribution in the active layer, thereby realizing a higher-output semiconductor laser that can perform laser oscillation with a stable transverse mode, which is used as a light source for a laser display.

Further, since RF waves of different frequencies are superposed on two electrode parts among the divided plural electrode parts, the spectrum width can be increased without increasing the power of the RF superposition. As a result, the speckle noise can be reduced without increasing the power consumption.

Embodiment 3

Figure 5:
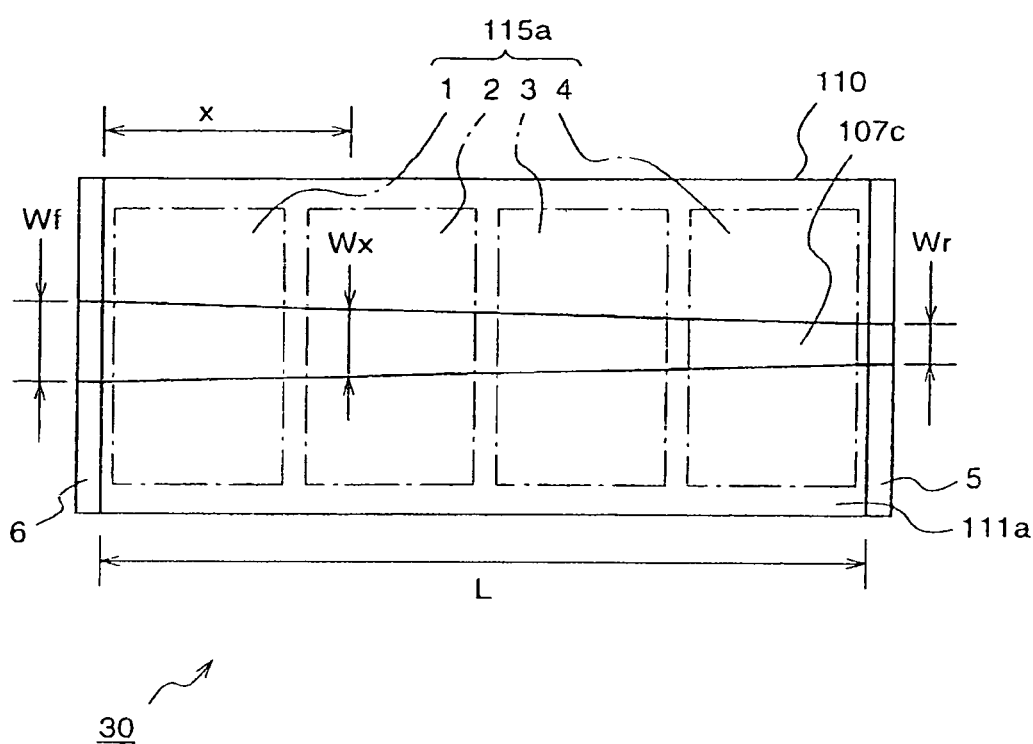
FIG. 5 is a plan view illustrating a semiconductor laser device according to a third embodiment of the present invention.

FIG. 5 is a diagram for explaining a semiconductor laser device according to a third embodiment of the present invention, illustrating a plan view of a stripe ridge of the semiconductor laser device.

The semiconductor laser device 30 according to the third embodiment is obtained by tapering the plane surface of the stripe ridge 107a of the semiconductor laser device 10 according to the first embodiment such that the width of the stripe ridge 107a is larger as closer to the light emission facet, and other constituents are identical to those of the semiconductor laser device of the first embodiment.

That is, the semiconductor laser device 30 of this third embodiment has a semiconductor layer laminated body 110 which is obtained by successively depositing, on an n type GaN substrate, an n type AlGaN cladding layer, an n type GaN lightguide layer, an active layer having a multiquantum well structure including InGaN, an undoped GaN cap layer, a p type GaN lightguide layer, and a p type AlGaN cladding layer, like the semiconductor laser device 10 according to the first embodiment.

In this third embodiment, the stripe ridge 107c formed on the surface of the semiconductor layer laminated body has a taper shape in which the width of the ridge is larger as closer to the light emission facet side, and a resonator performing laser oscillation is formed in a portion of the active layer, opposite to the stripe ridge 107c. The plane surface of the stripe ridge 107c is shaped symmetrically with the resonator axis as an axis of symmetry.

Further, an insulating film 111a is formed on the surface of the semiconductor layer laminated body 110 so as to expose the upper surface of the stripe ridge 107c, and a p electrode 115a is formed on the insulating film 111a so as to contact the exposed surface of the stripe ridge 107c.

The p electrode 115a is divided into four parts like the first embodiment, and the respective electrode parts 1~4 are arranged along the resonator length direction.

Next, the function and effect will be described.

In the semiconductor laser device according to the first or second embodiment, the distribution of the current injected into the divided plural electrode parts is adjusted according to the light intensity distribution in the axis direction of the resonator, thereby to realize high output power of the semiconductor laser. However, the light intensity distribution in the active layer is as shown in FIG. 3(a), and the light power density itself in each portion of the active layer is not changed. Therefore, the light power density in a region near the light emission facet is of a very high level, leading to the possibility of reduction in reliability.

On the other hand, in the semiconductor laser device 30 according to the third embodiment, since the stripe ridge 107c is formed in a taper shape at its plane surface, the waveguide width in the vicinity of the light emission facet can be increased, whereby the light power density can be reduced in a portion of the active layer near the light emission facet.

In the third embodiment, assuming that the resonator length is L, the stripe width at the front facet (light emission facet) is Wf, the stripe width at the rear facet is Wr, and the stripe width in a position where the distance from the front facet is x is Wx, the stripe ridge 107c is formed to satisfy a relationship, $$Wx = Wf - (Wf - Wr) \cdot x/L$$

For example, when the stripe ridge 107c is tapered such that the stripe width Wf at the front facet is 50 μm, and the ridge width Wr at the rear facet is 35 μm, the threshold current is decreased, and the slope efficiency is enhanced.

Further, in the semiconductor laser device 30 of the third embodiment, since the plane surface of the stripe ridge 107c is tapered as described above, the characteristic temperature is also significantly improved.

In the conventional laser structure in which the stripe width is 50 μm at the front facet and the rear facet, the level at which the transverse mode during continuous oscillation becomes unstable is 80 mW on an average. On the other hand, in the laser structure of the third embodiment in which the stripe width at the front facet is 50 μm and the stripe width at the rear facet is 35 μm, the level at which the transverse mode during continuous oscillation becomes unstable is 200 mW on an average, and stable laser oscillation with the transverse mode is realized until reaching high light output operation.

Further, when the p electrode is divided into four parts to make the injection current density have a distribution in the resonator length direction, the level at which the transverse mode becomes unstable can be increased to 300 mW. Further, the characteristic temperature is increased from 105K to 145K. Furthermore, as is evident from the reduction in the threshold current, the thermal saturation level is increased due to the reduction in the carrier density in the active layer.

By the way, although the light density in the active layer can be made uniform by tapering the plane surface of the stripe ridge, if the ratio of the stripe width at the front facet to the stripe width at the rear facet becomes too large, increase in propagation loss or the like occurs due to multimode waveguide or steep tapering, and therefore, the degree of tapering is limited. To be specific, it is difficult to make the stripe width at the front facet twice or more as large as the stripe width at the rear facet. Therefore, there is a limitation in reducing the light density by increasing the stripe width.

So, as shown in the first embodiment, the electrode is divided into parts, and the current density in a portion of the active layer near the light emission facet is increased, whereby the high output characteristic can be further improved.

However, when the stripe width significantly differs between the region near the front facet and the region near the rear facet, there is a possibility that scattering loss might be increased. Desirably, the ratio of the stripe width at the front facet to the stripe width at the rear facet should be within a range of 1<(stripe width at the front facet)/(stripe width at the rear facet)<2

As described above, according to the third embodiment, in the semiconductor laser device in which the light reflectivity at the light emission facet is different from the light reflectivity at the facet opposite to the light emission facet, the stripe ridge is tapered such that the width at the light emission facet is broad while the width at the opposite facet is narrow. The electrode disposed on the ridge is divided into plural electrode parts, and the electrode part closer to the light emission facet side has a higher injection current density. Therefore, the carrier density distribution in the active layer can be adjusted according to the light intensity distribution in the active layer, and the light power density in a portion of the active layer near the light emission facet can be reduced, thereby realizing a highly reliable high-output semiconductor laser that can perform laser oscillation with a stable transverse mode.

While in the respective embodiments mentioned above, the semiconductor laser element has the semiconductor layer laminated body shown in FIG. 1, the structure of the semiconductor laser element is not restricted thereto.

For example, the semiconductor layer laminated body constituting the semiconductor laser may be obtained by successively depositing, on an n type substrate, an n type cladding layer, an n type lightguide layer, an active layer having a multiquantum well structure, an undoped cap layer, a p type guide layer, a p type cladding layer, an etching stopper layer, and a second p type cladding layer. In this case, the etching stopper layer exists just beneath the stripe ridge.

Further, while in this third embodiment the plane surface of the stripe ridge is shaped such that its stripe width continuously varies from the front facet to the rear facet, the configuration of the plane surface of the stripe ridge is not restricted thereto.

Further, while in this third embodiment a GaN substrate is assumed as a semiconductor substrate, a substrate constituting a laser element may be any substrate so long as III-V group nitride base semiconductor materials can be epitaxially grown thereon, such as a sapphire substrate or a SiC substrate.

Further, while in this third embodiment a semiconductor laser comprising III-V group nitride base semiconductor materials is described, a semiconductor laser comprising, for example, AlGaAs system semiconductor materials or AlGaInP system semiconductor materials may be employed. Also in this case, it is possible to realize a high output semiconductor laser that can perform laser oscillation with a stable fundamental transverse mode.

Especially in a semiconductor laser device using AlGaInP system semiconductor materials, when a semiconductor laser laminated body is fabricated by depositing plural semiconductor layers on a GaAs substrate whose surface orientation is inclined from (100) to [0-11] or [011], no band gap variation occurs due to disordering of crystal, resulting in a stable high-output semiconductor laser.

Further, while in this third embodiment the semiconductor laser device comprises a single semiconductor laser element and has a single stripe ridge, a single semiconductor laser device may be a multi-beam type semiconductor laser comprising plural semiconductor laser elements and having plural stripe ridges, with the same effects as mentioned for the third embodiment.

Furthermore, while in this third embodiment the semiconductor laser device performs laser oscillation with a fundamental transverse mode, the semiconductor laser device may be a large-output semiconductor laser which does not necessarily require laser oscillation with only a fundamental transverse mode. Also in this case, gain saturation is relaxed by using the construction for adjusting the carrier injection density distribution according to the third embodiment, thereby realizing a larger output semiconductor laser.

Furthermore, in this third embodiment, the plane surface of the stripe ridge of the semiconductor laser device is tapered to reduce the light power density in the vicinity of the light emission facet. However, instead of tapering the plane surface of the stripe ridge, part or all of the divided plural electrode parts disposed on the stripe edge may be tapered.

Figure 6A:
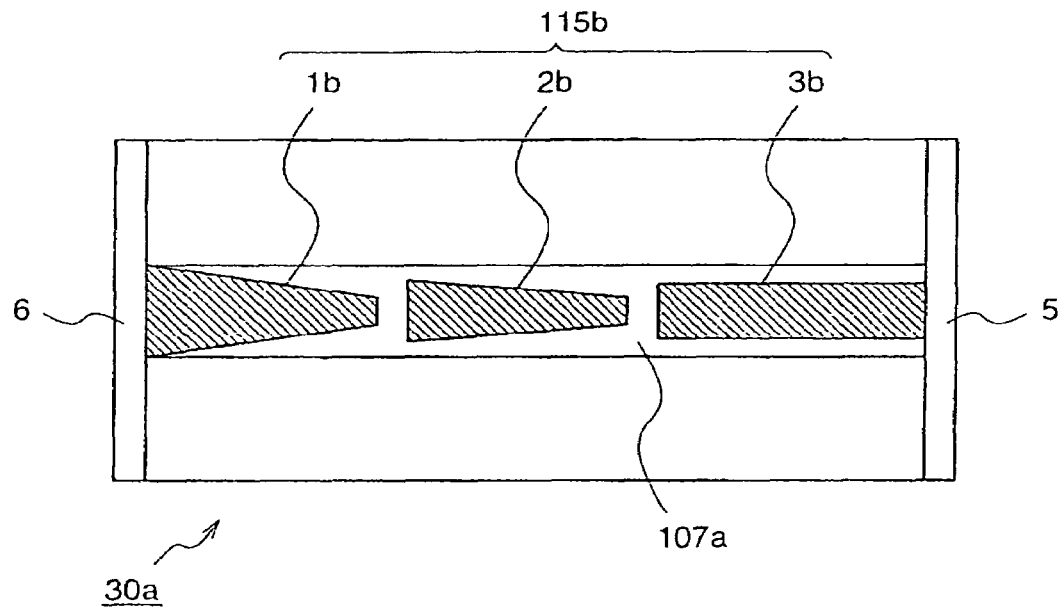
FIG. 6(a) is a diagram for explaining another example of an electrode division structure in the semiconductor laser device according to the third embodiment.

For example, FIG. 6(a) shows a semiconductor laser device 30a in which some of the divided plural electrode parts disposed on the stripe ridge are tapered at the plane surfaces thereof.

In the semiconductor laser device 30a, the p electrode 115b disposed on the stripe ridge 107a is divided into three parts, and the electrode part 1b positioned at the light emission facet side and the electrode part 2b next to the electrode part 1b are tapered at the plane surfaces thereof such that the stripe widths thereof at the light emission facet 6 side are broader than the stripe widths at the opposite side facet 5 side. Further, the electrode part 3b that is positioned close to the facet 5 opposite to the light emission facet 6 is shaped in horizontally-long rectangle. The stripe width on the light emission facet 6 side, of the electrode part 1b that is closest to the light emission facet 6 is wider than the stripe width of the adjacent electrode part 2a on the light emission facet 6 side. The cross-sectional configuration of the laser element of the semiconductor laser device 30a is identical to that of the first embodiment shown in FIG. 1.

Figure 6B:
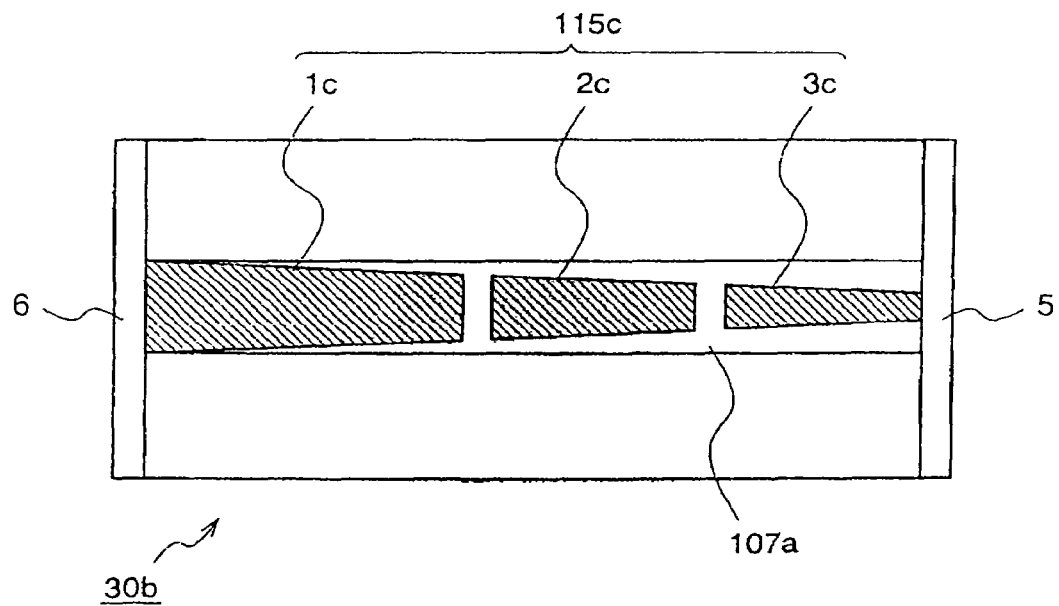
FIG. 6(b) is a diagram for explaining another example of an electrode division structure in the semiconductor laser device according to the third embodiment.

FIG. 6(b) shows a semiconductor laser device 30b in which all of the divided plural electrode parts disposed on the stripe ridge are tapered at the plane surfaces thereof.

In the semiconductor laser device 30b, the p electrode 115c disposed on the stripe ridge 107a is divided into three parts, and the respective electrode parts 1c~3c are tapered at the plane surfaces thereof such that the stripe widths thereof on the light emission facet 6 side are wider than the stripe widths on the opposite facet 5 side. The cross-sectional configuration of the laser element of the semiconductor laser device 30b is identical to that of the first embodiment shown in FIG. 1.

As described above, at least some of the divided plural electrode parts disposed on the stripe ridge of the semiconductor laser are tapered at the plane surfaces thereof, whereby the amounts of current injected into the respective electrode parts can be controlled in accordance with the light power density that increases as closer to the light emission facet, and mismatch between the injection carrier density distribution and the light power density distribution can be improved. As a result, reduction in carrier loss can be achieved, resulting in a highly efficient semiconductor laser device.

Further, in the respective embodiments mentioned above, the stripe ridge has a uniform distribution of resistance values in the resonator length direction, a resistive layer whose resistance value is variable along the resonator axis direction may be disposed on the upper surface of the stripe ridge. In this case, by setting the resistance value of the resistive layer small at the front facet side of the resonator and large at the rear facet side thereof, the carrier density distribution in the active layer can be more matched to the light intensity distribution in the active layer.

Embodiment 4

FIG. 7 is a diagram for explaining a semiconductor laser device according to a fourth embodiment of the present invention.

The semiconductor laser device 40 according to the fourth embodiment is a multi-stripe structure laser chip in which forty laser elements LD-1~LD-n (n=40) are integrated on a single common semiconductor substrate, and the respective laser elements LD-1~LD-n (n=40) have the same construction as the semiconductor laser device 10 of the first embodiment shown in FIG. 2(a). Further, separation resistive parts (not shown) for separating the adjacent semiconductor laser elements are formed on the semiconductor substrate of the semiconductor laser device 40. The separation resistive part is a groove formed by etching a portion between the adjacent laser elements, and increases a resistance between the electrodes of the adjacent laser elements. The groove has a depth that does not affect light guided into the active layer, and the groove prevents reduction in efficiency due to increase in loss of light quantity.

Like in the first embodiment, the common semiconductor substrate is an n type GaN substrate, and an n type AlGaN cladding layer, an n type GaN lightguide layer, an active layer having a multiquantum well structure including InGaN, an undoped GaN cap layer, a p type GaN lightguide layer, and a p type AlGaN cladding layer are successively grown on the n type GaN substrate.

Stripe ridges 107a1~107an constituting the respective laser elements LD-1~LD-n are formed on the upper surface of the semiconductor layer laminated body 110d comprising the common semiconductor substrate and the plural semiconductor layers. Portions of the active layer 104d as a constituent of the laser chip, which portions are opposite to the respective stripe ridges 107a1~107an, serve as resonators of the respective laser elements, and laser beams LB-1~LB-n are emitted from the respective laser elements LD-1~LD-n. The width of each stripe ridge is 50 μm, and the width of each laser element is 300 μm. Accordingly, the width of this semiconductor laser chip, i.e., the size in the resonator width direction, is 12 mm.

Next, the function and effect will be described.

In order to realize a large screen of 100-inch class by laser irradiation, an output of several W is needed as a light source characteristic. Further, in order to obtain a full-color output, it is necessary to provide lasers of several W class as lasers of wavelength regions of red, blue, and groove, respectively. However, it is difficult to obtain an output of W class by a semiconductor laser of a single stripe structure.

On the other hand, the semiconductor laser 40 of the fourth embodiment adopts a multi-stripe structure to realize an output of several W.

In the semiconductor laser chip 40 according to the fourth embodiment, an output per stripe, i.e., an output from one semiconductor laser, is about 100 mW, and an output of 4 W per chip is realized. Further, like the semiconductor laser device of the first embodiment, each laser element has a structure in which a p electrode disposed on the stripe ridge is divided into four parts, and this electrode division structure improves high output characteristic, which will be briefly described hereinafter.

Initially, since the electrode division structure is employed, the output is not destabilized due to kink or hole burning even during high output operation, thereby realizing stable output. Further, it is possible to apply, at a low voltage, RF superposition that is needed for reduction in speckle noise, which is essential for application to a display.

Further, as described for the first embodiment, when RF signals of different frequencies are applied to some of the plural electrode parts by utilizing the separation resistive parts, reduction of coherence is achieved with relatively small RF voltage, whereby speckle noise can be reduced. Especially in the case of a large output semiconductor laser, the amount of current applied to the entire semiconductor laser is enormous, and it is impossible to apply an RF signal to the entire injection current when the amount of electric power is considered. However, when the p electrode is divided into parts as described above, the amount of electric power of the RF signal can be significantly reduced, and thereby reduction in speckle noise can be realized even in a W-class semiconductor laser.

Further, the efficiency of the semiconductor laser chip according to the fourth embodiment can be further increased by using the following method.

Initially, in the respective laser elements, at least one of various parameters such as the frequency of an RF signal to be applied, the amount of electric power, the electrode position, the electrode shape, and the stripe width, is set at different values, whereby the laser beams emitted from the respective laser elements have different wavelengths, and the whole laser spectrum emitted from the semiconductor laser device extends broadly. As a result, the coherence of the laser beam is significantly reduced, resulting in significantly reduction in speckle noise.

Further, when the plane surface of the stripe ridge of each laser element is tapered as described for the third embodiment, excessive concentration of the light power density can be avoided, leading to higher output power of each laser element. As a result, further increase in the output power of the multi-stripe laser can be achieved. To increase the output powers of the respective laser elements constituting the laser chip realizes a laser chip of the same output power with less number of laser elements, and therefore, it is effective in improving the yield and reducing the cost.

As described above, according to the fourth embodiment, the laser elements having the same electrode structure as the semiconductor laser device of the first embodiment are integrated on the same substrate to constitute a multi-stripe laser chip. Therefore, it is possible to realize a large output of watt class which is difficult to realize in a single-stripe semiconductor laser, resulting in a semiconductor laser which can be used as a light source for a laser display.

Further, since the electrodes of the respective laser elements constituting the laser chip are divided into parts, the injection current density distribution in each laser element can be matched to the light intensity distribution, whereby stable output can be obtained. Further, since an RF signal is superposed on only specific electrode parts, reduction in speckle noise can be achieved by low-power RF superposition.

Furthermore, since the parameters that determine the characteristics of the respective laser elements are made to have different values for the respective laser elements, further reduction in speckle noise can be achieved.

Moreover, when the stripe ridges of the respective laser elements are tapered at the plane surfaces thereof, the light intensity distribution in the active layer is made uniform to realize higher output powers of the respective laser elements.

Embodiment 5

In a fifth embodiment, a description will be given of a laser display which is a kind of a laser projector using a semiconductor laser device according to any of the first to fourth embodiments.

A laser display comprises an RGB light source and a projection optical system, and projects light emitted from the laser light source onto a screen or the like by the projection optical system, thereby to project a full-color image. Such laser display is classified into a type of projecting light onto an external screen or wall to see the reflected light, and a type of applying light from the rear surface of a screen to see the transmitted light. In any case, colors are recognized by the light scattered at the screen or the like.

Figure 8:
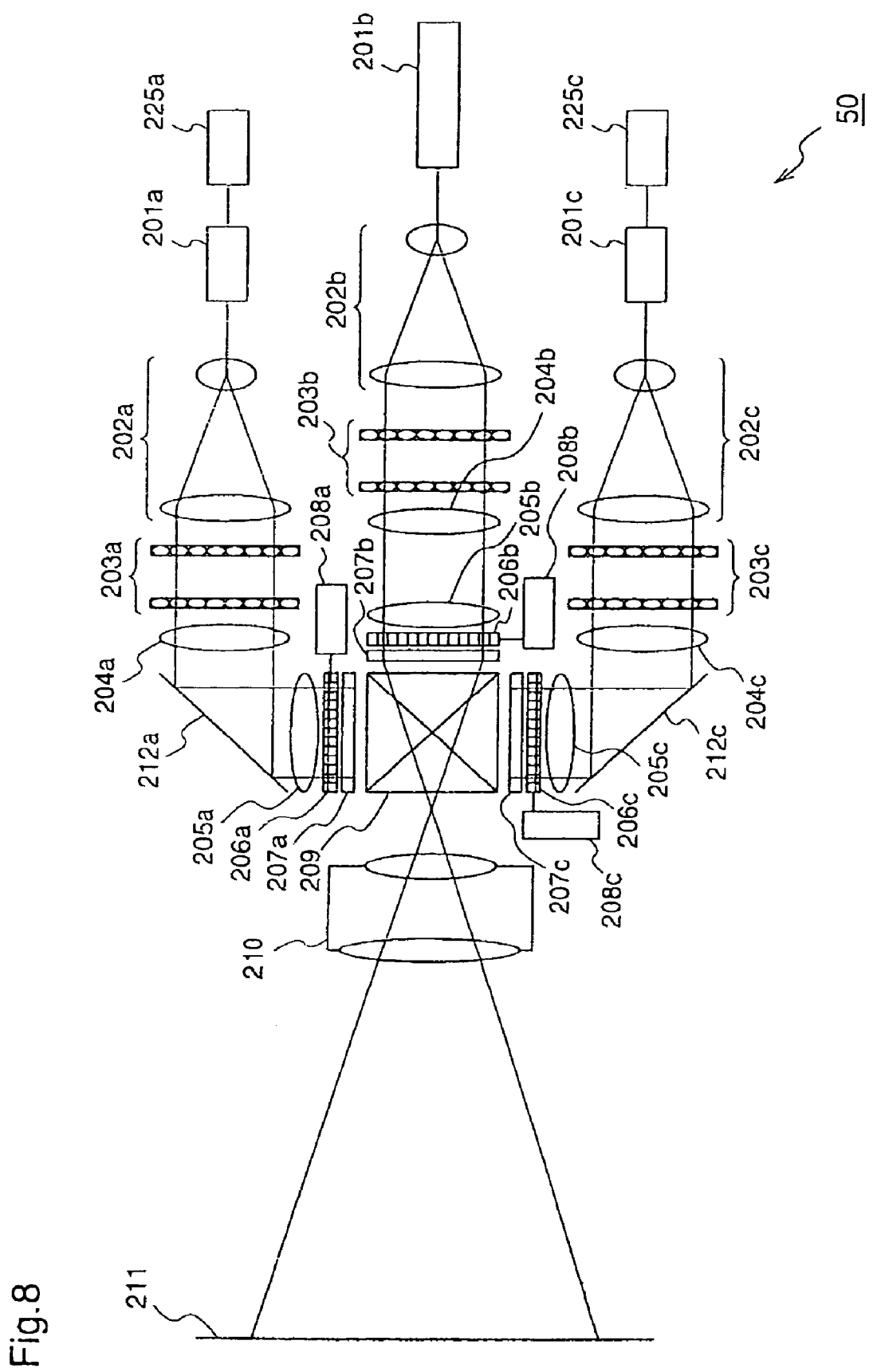
FIG. 8 is a diagram for explaining a laser projector according to a fifth embodiment of the present invention.

FIG. 8 shows an example of a laser display according to the fifth embodiment of the present invention.

The laser display 50 shown in FIG. 8 includes laser light sources 201a~201c for emitting laser lights of three colors of R, G, and B, diffusers 206a~206c for diffusing light, and optical systems for irradiating the diffusers 206a~206c with the laser lights emitted from the laser light sources 201a~201c, respectively. The laser display 50 further includes diffuser vibration units 208a~208c for vibrating the diffusers 206a~206c, and spatial light modulators 207a~207c for modulating the lights from the laser light sources 201a~201c, which are diffused by the diffusers 206a~206c. Further, the laser display 50 includes a dichroic prism 209 for multiplexing the lights passing through the spatial light modulators 207a~207c, and a projection lens 210 for expanding and projecting the light multiplexed by the dichroic prism 209 on a screen 211.

The laser light source 201a is a red laser source for emitting red laser light, and has the same element structure as the semiconductor laser device 10 according to the first embodiment. An optical system corresponding to the red laser source 201a includes a beam expander 202a for expanding the light emitted from the laser light source 201a, and a light integrator 203a for making the in-plane intensity distribution of the light expanded by the beam expander 202a uniform. Further, this optical system includes a condenser lens 304a for condensing the light from the light integrator 203a, a mirror 212a for reflecting the light condensed by the condenser lens 204a, and a field lens 205a for converting the reflected light from the mirror 212a into a convergent beam, and irradiating the diffuser 206a with the convergent beam. The oscillation spectrum of the red laser source 201a is increased by connecting an RF power supply 225a corresponding to the RF power supply 23 or 24 shown in FIG. 2(b) to the red laser source 201a.

The laser light source 201b is a green laser source for emitting green laser light, and an optical system corresponding to the green laser source 201b includes a beam expander 202b for expanding the light emitted from the laser light source 201b, and a light integrator 203b for making the cross-section intensity distribution of the light expanded by the beam expander 202b uniform. This optical system further includes a condenser lens 204b for condensing the light from the light integrator 203b, and a field lens 205b for converting the light condensed by the condenser lens 204b into a convergence beam, and irradiating the diffuser 206b with the convergence beam.

The laser light source 201c is a blue laser source for emitting blue laser light, and has the same element structure as the semiconductor laser device 10 according to the first embodiment shown in FIG. 2(a). An optical system corresponding to the blue laser source 201c includes a beam expander 202c for expanding the light emitted from the laser light source 201c, and a light integrator 203c for making the cross-section intensity distribution of the light expanded by the beam expander 202c uniform. This optical system further includes a condenser lens 204c for condensing the light that is enlarged and projected by the light integrator 203c, a mirror 212c for reflecting the light condensed by the condenser lens 204c, and a field lens 205c for converting the reflected light from the mirror into a convergence beam, and irradiating the diffuser 206c with the convergence beam. The oscillation spectrum of the blue laser source 201c is increased by connecting an RF power supply 225c corresponding to the RF power supply 23 or 24 shown in FIG. 2(b) to the blue laser source.

Next, the function and effect will be described.

Initially, the operation of the laser display 50 will be described.

The laser lights outputted from the red, green, and blue laser sources 201a, 201b, and 201c are expanded by the beam expanders 202a, 202b, and 202c, and pass through the light integrators 203a, 203b, and 203c to enter the condenser lenses 204a, 204b, and 204c, respectively. The optical paths of the red and blue laser lights condensed by the condenser lenses 204a and 204c are bent at 90° by the mirrors 215a and 215c, and then the laser lights pass through the field lenses 205a and 205c to enter the diffusers 206a and 206c. The green laser light condensed by the condenser lens 204b pass through the field lens 205b to enter the diffuser 206b. The respective diffusers 206a, 206b, and 206c are vibrated by the diffuser vibration units 213a, 213b, and 213c. The laser lights passing through the diffusers 206a, 206b, and 206c are applied onto the spatial light modulators 207a, 207b, and 207c.

At this time, the illumination intensity distributions on the spatial light modulators 207a, 207b, and 207c are uniform because the laser lights of red, green, and blue which are incident on the respective spatial light modulators have passed through the integrators 203a, 203b, and 203c.

In the spatial light modulators 207a, 207b, and 207c, the laser lights of red, green, and blue are independently modulated, and the modulated laser lights are multiplexed by the dichroic prism 209, and expanded and projected by the projection lens 210 to make an image on the screen 211.

In the image projected on the screen, speckle noise is time-averaged to be suppressed by vibrations of the diffusers 206a, 206b, and 206c.

Next, the characteristics of the laser display according to the fifth embodiment will be described.

In the conventional laser display, when a high-coherence semiconductor laser is utilized, speckle noise occurs due to interference of lights scattered on the screen. An effective method for reducing the speckle noise is to reduce the coherence of the laser light. In order to reduce the coherence of the laser light, it is effective to convert the vertical mode to a multi mode. Especially when the spectrum width of the vertical mode is expanded, the speckle noise can be significantly reduced.

In the semiconductor laser device used in the laser display according to the fifth embodiment, as described for the first embodiment, an RF signal is superposed on some of the divided plural electrode parts to expand the spectrum width, whereby the coherence can be reduced. In order to reduce the speckle noise, it is required to expand the vertical mode spectrum by 1 nm or more in wavelength, more preferably, about 5 nm or more. While expansion of the vertical mode spectrum can be realized by utilizing the above-mentioned RF wave superposition method for superposing an RF signal on some of the divided plural electrode parts, the spectrum expansion range can be further increased by applying the method to a wide-stripe laser structure having a large stripe width. Further expansion of the spectrum can be achieved by applying RF waves of different frequencies to different electrode parts or by using a multi-stripe laser.

By the way, the oscillation wavelengths of the R, G, B light sources are important, in view of the relationship between the wavelength of the laser display and the visibility. A wavelength to be used and a required light intensity are determined depending on the influence of visibility. Further, a wavelength and a range of color reproducibility are determined depending on the influence of chromaticity.

Figure 9:
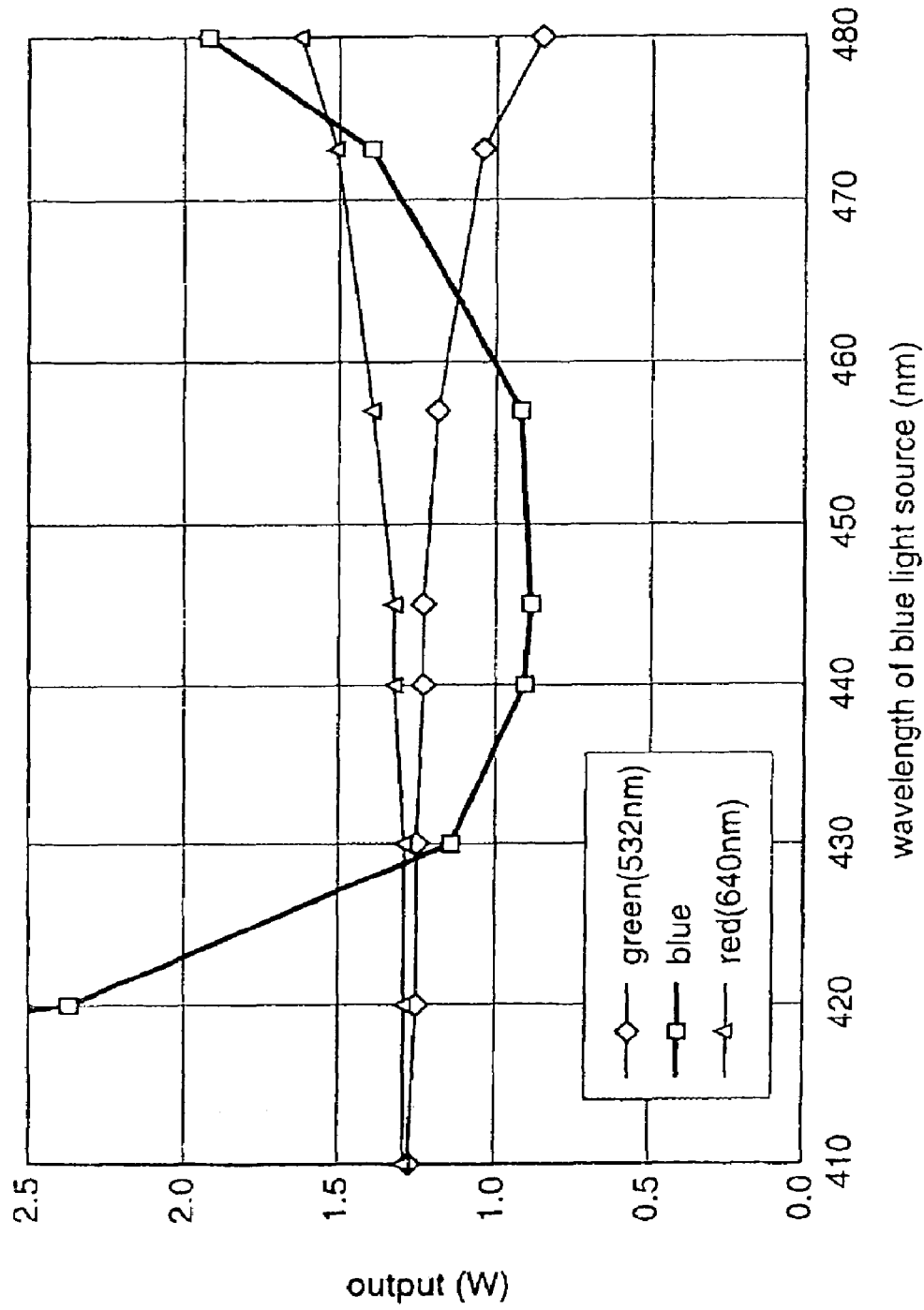
FIG. 9 is a diagram illustrating the relationship between the wavelength of the semiconductor laser and required output.

FIG. 9 shows the relationship between the wavelength of a blue light source and the required output. To be specific, FIG. 9 shows the relationship between the wavelength of blue and the required output, for realizing brightness of 1000 lm when the wavelength of red is fixed to 640 nm and the wavelength of green is fixed to 532 nm.

Since the visibility of the blue light deteriorates when the wavelength becomes 430 nm or less, the required power increases steeply. When the wavelength of the blue light becomes 460 nm or more, since it approaches the region of green, the expressible color range becomes narrower and simultaneously the power required for realizing white balance increases. At the same time, the power of red also increases.

On the other hand, as for a blue laser comprising GaN system semiconductors, usually, a high output laser is realized at a wavelength near 410 nm. Although the dose of In must be increased to shift this wavelength to the longer-wavelength side, such increase in dose of In causes deterioration in the crystal quality, leading to reductions in reliability and high output characteristic. Accordingly, in the blue laser comprising GaN system materials, it is desired to set the wavelength to 455 nm or less. From the viewpoint of color reproducibility, it is preferable to use the blue light source of a relatively short wavelength because the range of expressible colors is extended in the blue region.

From the above-mentioned viewpoints, the wavelength region of the blue laser is preferably 430 nm~455 nm. More preferably, the wavelength region should be 440 nm~450 nm. In this case, reduced power consumption and high color reproducibility are achieved by reduction in the required power.

As for the output light intensity, in order to realize a large image of 80 inches or more, an output of several W is required. In this case, the laser structure is desired to be a wide-stripe laser structure capable of high power output, or an array structure. The wide-stripe structure is effective to realize a high-output and high-reliability structure. Since the light condensing up to diffraction limit is not required of the laser display, single mode characteristic is not required for both the vertical mode and the transverse mode. Therefore, the transverse mode single waveguide characteristic, which is utilized in such as an optical disc and optical communication, is not required. Accordingly, it is possible to realize high output power, improved yield, and improved reliability, as compared with the wide-stripe structure which can easily realize high output power.

As described above, according to the fifth embodiment, a semiconductor laser in which the light reflectivity at the light emission facet is different from the light reflectivity at the facet opposite to the light emission facet is used as a light source for a laser display, and the electrode disposed on the stripe ridge of the semiconductor laser is divided into plural parts, and driving voltages are applied to the respective electrode parts so that the density of the injection current corresponding to the electrode part closer to the light emission facet side becomes higher. Therefore, it is possible to obtain a light source for a laser display, which is highly reliable and can perform laser oscillation with a stable transverse mode.

Further, in the laser display of the fifth embodiment, an RF signal is superposed on some of the divided plural electrode parts, whereby the spectrum width is increased to reduce the speckle noise. Further, when the semiconductor laser as a light source is constructed such that RF waves of different wavelengths are applied to different electrode parts or it is implemented by a multistripe laser, further increase in the spectrum width can be realized.

APPLICABILITY IN INDUSTRY

A semiconductor laser device of the present invention can prevent the high-output characteristic from being degraded due to destabilization of transverse mode or reduction in gain which are caused by hole burning in the resonator axis direction due to biased light power density distribution in the resonator length direction, and it is useful as a light source for an optical recording device, optical display device, and the like which require high-output semiconductor lasers, and moreover, it is also applicable to laser processing, medical care, and the like.

The invention claimed is:

1. A semiconductor laser device including a semiconductor laser element having a ridge type cladding layer, on a semiconductor substrate, said semiconductor laser element comprising:

a resonator for performing laser oscillation due to injection of carriers, the resonator having different reflectivities at a front facet and a rear facet, the front facet and the rear facet being arranged on opposite sides of the resonator;

a stripe structure for injecting carriers into the resonator, extending in an axis direction of the resonator; and an electrode disposed on an upper portion of the stripe structure, wherein said electrode is divided into two or more parts so that plural electrode parts are arranged along the resonator axis direction, wherein, among the plural electrode parts, a current is to be injected into an electrode part that is positioned in the vicinity of the front facet of the resonator from which laser light is emitted, so as to obtain a larger current density in an active layer of the electrode part as compared with a current density in an electrode part that is positioned in the vicinity of the rear facet of the resonator, and wherein said stripe structure has a taper shape in which a stripe width at the front facet of the resonator from which laser light is emitted is larger than a stripe width at the rear facet.

2. A semiconductor laser device as defined in claim 1, wherein a resonator length is L, the stripe width at the front facet is Wf, the stripe width at the rear facet is Wr, and a stripe width in a position at a distance x from the front facet is Wx, said stripe structure is formed so as to satisfy a relationship of $Wx=Wf-(Wf-Wr)\cdot x/L$.

3. A semiconductor laser device as defined in claim 2, wherein said stripe structure is formed so as to have a planar shape in which a ratio of the stripe width at the front facet to the stripe width at the rear facet satisfies a relationship of 1<(stripe width at the front facet)/(stripe width at the rear facet)<2.

4. A semiconductor laser device as defined in claim 1, wherein an oscillation wavelength of laser light emitted from the semiconductor laser element is 430~455 nm.

5. A semiconductor laser device as defined in claim 1, wherein said semiconductor laser element emits laser light whose vertical mode spectrum is in a multimode.

6. A semiconductor laser device as defined in claim 1, wherein said semiconductor laser element emits laser light whose vertical mode spectrum width expands by 1 nm or more.

7. A laser projector comprising:

a semiconductor laser device for emitting laser light; and an optical system for projecting laser light emitted from the semiconductor laser device, said semiconductor laser device comprising the semiconductor laser device as defined in claim 1.

8. A semiconductor laser device including a semiconductor laser element having a ridge type cladding layer, on a semiconductor substrate, said semiconductor laser element comprising:

a resonator for performing laser oscillation due to injection of carriers, the resonator having different reflectivities at a front facet and a rear facet;

a stripe structure for injecting carriers into the resonator, extending in an axis direction of the resonator; and an electrode disposed on an upper portion of the stripe structure, wherein said electrode is divided into two or more parts so that plural electrode parts are arranged along the resonator axis direction, wherein, among the plural electrode parts, a current is to be injected into an electrode part that is positioned in the vicinity of the front facet of the resonator from which laser light is emitted, so as to obtain a larger current density in an active layer of the electrode part as compared with a current density in an electrode part that is positioned in the vicinity of the rear facet of the resonator, and wherein at least one electrode part among the plural electrode parts has a taper shape in which a width on a front facet side is different from a width on a rear facet side.

9. A semiconductor laser device as defined in claim 8, wherein an electrode part close to a front facet side among the plural electrode parts has a taper shape in which a width on the front facet side is different from a width on a rear facet side.

10. A semiconductor laser device as defined in claim 8, wherein an oscillation wavelength of laser light emitted from the semiconductor laser element is 430~455 nm.

11. A semiconductor laser device as defined in claim 8, wherein said semiconductor laser element emits laser light whose vertical mode spectrum is in a multimode.

12. A semiconductor laser device as defined in claim 8, wherein said semiconductor laser element emits laser light whose vertical mode spectrum width expands by 1 nm or more.

13. A laser projector comprising:
a semiconductor laser device for emitting laser light; and
an optical system for projecting laser light emitted from the semiconductor laser device, said semiconductor laser device comprising the semiconductor laser device as defined in claim 8.

14. A semiconductor laser device including a semiconductor laser element having a ridge type cladding layer, on a semiconductor substrate, said semiconductor laser element comprising:

a resonator for performing laser oscillation due to injection of carriers, the resonator having different reflectivities at a front facet and a rear facet;

a stripe structure for injecting carriers into the resonator, extending in an axis direction of the resonator; and an electrode disposed on an upper portion of the stripe structure, wherein said electrode is divided into two or more parts so that plural electrode parts are arranged along the resonator axis direction, wherein, among the plural electrode parts, a current is to be injected into an electrode part that is positioned in the vicinity of the front facet of the resonator from which laser light is emitted, so as to obtain a larger current density in an active layer of the electrode part as compared with a current density in an electrode part that is positioned in the vicinity of the rear facet of the resonator, and wherein each of the plural electrode parts has a taper shape in which a width on a front facet side is different from a width on a rear facet side.

15. A semiconductor laser device as defined in claim 14, wherein an oscillation wavelength of laser light emitted from the semiconductor laser element is 430~455 nm.

16. A semiconductor laser device as defined in claim 14, wherein said semiconductor laser element emits laser light whose vertical mode spectrum is in a multimode.

17. A semiconductor laser device as defined in claim 14, wherein said semiconductor laser element emits laser light whose vertical mode spectrum width expands by 1 nm or more.

18. A laser projector comprising:
a semiconductor laser device for emitting laser light; and
an optical system for projecting laser light emitted from the semiconductor laser device, said semiconductor laser device comprising the semiconductor laser device as defined in claim 14.

19. A semiconductor laser device including a semiconductor laser element having a ridge type cladding layer, on a semiconductor substrate, said semiconductor laser element comprising:

a resonator for performing laser oscillation due to injection of carriers, the resonator having different reflectivities at a front facet and a rear facet;

a stripe structure for injecting carriers into the resonator, extending in an axis direction of the resonator; and an electrode disposed on an upper portion of the stripe structure, wherein said electrode is divided into two or more parts so that plural electrode parts are arranged along the resonator axis direction, wherein, among the plural electrode parts, a current is to be injected into an electrode part that is positioned in the vicinity of the front facet of the resonator from which laser light is emitted, so as to obtain a larger current density in an active layer of the electrode part as compared with a current density in an electrode part that is positioned in the vicinity of the rear facet of the resonator, and wherein said stripe structure has a resistive layer formed on the upper portion thereof, and said resistive layer has a resistance value that varies from the front facet of the resonator at which laser light is emitted, to the rear facet.

20. A semiconductor laser device as defined in claim 19, wherein an oscillation wavelength of laser light emitted from the semiconductor laser element is 430~455 nm.

21. A semiconductor laser device as defined in claim 19, wherein said semiconductor laser element emits laser light whose vertical mode spectrum is in a multimode.

22. A semiconductor laser device as defined in claim 19, wherein said semiconductor laser element emits laser light whose vertical mode spectrum width expands by 1 nm or more.

23. A laser projector comprising:
a semiconductor laser device for emitting laser light; and
an optical system for projecting laser light emitted from the semiconductor laser device, said semiconductor laser device comprising the semiconductor laser device as defined in claim 19.

24. A semiconductor laser device including a plurality of semiconductor laser elements each having a ridge type cladding layer, the plurality of semiconductor laser elements being integrated on a semiconductor substrate, each of said semiconductor laser elements comprising:

a resonator for performing laser oscillation due to injection of carriers, the resonator having different reflectivities at a front facet and a rear facet;

a stripe structure for injecting carriers into the resonator, extending in an axis direction of the resonator; and an electrode disposed on an upper portion of the stripe structure, wherein said electrode is divided into two or more parts so that plural electrode parts are arranged along the resonator axis direction, wherein, among the plural electrode parts, a current is to be injected into an electrode part that is positioned in the vicinity of the front facet of the resonator from which laser light is emitted, so as to obtain a larger current density in an active layer of the electrode part as compared with a current density in an electrode part that is positioned in the vicinity of the rear facet of the resonator, and wherein separation resistive parts for separating adjacent semiconductor laser elements are formed on the semiconductor substrate.

25. A semiconductor laser device as defined in claim 24, wherein at least one of the semiconductor laser elements oscillates laser light with a wavelength that is different from those of others of the semiconductor laser elements.

26. A semiconductor laser device as defined in claim 24, wherein at least one of the semiconductor laser elements is driven with an injection current that is different from those of others of the semiconductor laser elements.

27. A semiconductor laser device as defined in claim 24, wherein the stripe structure of at least one of the semiconductor laser elements has a width that is different from widths of stripe structures of others of the semiconductor laser elements.

28. A semiconductor laser device as defined in claim 24, wherein an oscillation wavelength of laser light emitted from each of the semiconductor laser elements is 430~455 nm.

29. A semiconductor laser device as defined in claim 24, wherein said semiconductor laser elements each emit laser light whose vertical mode spectrum is in a multimode.

30. A semiconductor laser device as defined in claim 24, wherein said semiconductor laser elements emit laser light whose vertical mode spectrum width expands by 1 nm or more.

31. A laser projector comprising:

a semiconductor laser device for emitting laser light; and an optical system for projecting laser light emitted from the semiconductor laser device, said semiconductor laser device comprising the semiconductor laser device as defined in claim 24.

* * * * *